US011955063B2

(12) United States Patent
Han et al.

(10) Patent No.: US 11,955,063 B2
(45) Date of Patent: Apr. 9, 2024

(54) DISPLAY PANEL AND DISPLAY DEVICE

(71) Applicant: BOE TECHNOLOGY GROUP CO., LTD., Beijing (CN)

(72) Inventors: Ying Han, Beijing (CN); Pan Xu, Beijing (CN); Xing Zhang, Beijing (CN); Chengyuan Luo, Beijing (CN); Donghui Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/042,342

(22) PCT Filed: May 31, 2022

(86) PCT No.: PCT/CN2022/096245
§ 371 (c)(1),
(2) Date: Feb. 21, 2023

(87) PCT Pub. No.: WO2023/103300
PCT Pub. Date: Jun. 15, 2023

(65) Prior Publication Data
US 2024/0038142 A1 Feb. 1, 2024

(30) Foreign Application Priority Data
Dec. 9, 2021 (CN) .......................... 202111499616.4

(51) Int. Cl.
*G09G 3/12* (2006.01)
*G09G 3/30* (2006.01)
(Continued)

(52) U.S. Cl.
CPC ............ *G09G 3/32* (2013.01); *H01L 27/124* (2013.01); *G09G 2300/0408* (2013.01);
(Continued)

(58) Field of Classification Search
CPC ............ G09G 3/32; G09G 2300/0408; G09G 2300/0842; G09G 2310/0262;
(Continued)

(56) References Cited

U.S. PATENT DOCUMENTS 6,909,240 B2   6/2005  Osame et al.
7,262,556 B2   8/2007  Osame et al.
(Continued)

FOREIGN PATENT DOCUMENTS

CN   1432984 A   7/2003
CN   1991947 A   7/2007
(Continued)

OTHER PUBLICATIONS

First Office Action, including Search Report, for Chinese Patent Application No. 202111499616.4, dated Jun. 30, 2022, 26 pages.

*Primary Examiner* — Sanghyuk Park
(74) *Attorney, Agent, or Firm* — Westman, Champlin & Koehler, P.A.

(57) ABSTRACT

A display panel includes: plurality of pixel circuits arranged on base substrate, at least one pixel circuit includes a drive transistor and a first switch transistor an active layer arranged on base substrate and including a first active portion and a second active portion, the first active portion configured to form a channel portion of the drive transistor, the second active portion is configured to form a second electrode connection portion of the first switch transistor; and a first conductive layer arranged on a side of the active layer away from the base substrate, the first conductive layer includes a first conductive portion, a portion of the first conductive portion used to form a gate electrode of the drive transistor another portion is electrically connected to the second active portion, and a channel length of the channel portion of the drive transistor is greater than a channel width.

20 Claims, 12 Drawing Sheets

(51) Int. Cl.
*G09G 3/32* (2016.01)
*H01L 27/12* (2006.01)

(52) U.S. Cl.
CPC .............. *G09G 2300/0842* (2013.01); *G09G 2310/0262* (2013.01); *G09G 2310/08* (2013.01); *G09G 2320/02* (2013.01); *H01L 27/1222* (2013.01)

(58) Field of Classification Search
CPC ............ G09G 2310/08; G09G 2320/02; H01L 27/1222; H01L 27/124
See application file for complete search history.

(56) References Cited

U.S. PATENT DOCUMENTS

| | | | |
|---|---|---|---|
| 8,004,481 | B2 | 8/2011 | Yamazaki et al. |
| 8,212,750 | B2 | 7/2012 | Yamazaki et al. |
| 8,531,364 | B2 | 9/2013 | Yamazaki et al. |
| 8,723,760 | B2 | 5/2014 | Osame et al. |
| 9,086,604 | B2 | 7/2015 | Liu |
| 9,470,939 | B2 | 10/2016 | Liu |
| 10,497,323 | B2 | 12/2019 | Zhou et al. |
| 10,811,438 | B2 | 10/2020 | Choi |
| 10,978,613 | B2 | 4/2021 | Osame et al. |
| 11,183,142 | B2 | 11/2021 | Liu et al. |
| 11,195,484 | B2 | 12/2021 | Li et al. |
| 11,210,989 | B2 | 12/2021 | Xu et al. |
| 11,239,297 | B2 | 2/2022 | Song et al. |
| 11,296,168 | B2 | 4/2022 | Gao et al. |
| 11,296,171 | B2 | 4/2022 | Mou et al. |
| 11,355,051 | B2 | 6/2022 | Shen et al. |
| 11,653,530 | B2 | 5/2023 | Mou et al. |
| 2003/0222589 | A1 | 12/2003 | Osame et al. |
| 2003/0234392 | A1* | 12/2003 | Kung .................. G09G 3/3233 257/13 |
| 2004/0196218 | A1* | 10/2004 | Senda .................. G09G 3/3258 438/22 |
| 2005/0231122 | A1 | 10/2005 | Osame et al. |
| 2007/0126666 | A1 | 6/2007 | Yamazaki et al. |
| 2008/0111773 | A1* | 5/2008 | Tsuge .................. G09G 3/3241 345/76 |
| 2008/0170005 | A1 | 7/2008 | Osame et al. |
| 2011/0304525 | A1 | 12/2011 | Yamazaki et al. |
| 2012/0242563 | A1 | 9/2012 | Yamazaki et al. |
| 2013/0248892 | A1 | 9/2013 | Osame et al. |
| 2015/0301416 | A1 | 10/2015 | Liu |
| 2018/0026153 | A1 | 1/2018 | Osame et al. |
| 2018/0130411 | A1* | 5/2018 | Zhou .................... G09G 3/3225 |
| 2018/0166025 | A1 | 6/2018 | Zhou et al. |
| 2019/0164999 | A1 | 5/2019 | Choi |
| 2019/0206972 | A1 | 7/2019 | Park et al. |
| 2019/0229169 | A1 | 7/2019 | Huang et al. |
| 2019/0371251 | A1 | 12/2019 | Fan et al. |
| 2020/0193932 | A1 | 6/2020 | Liu et al. |
| 2020/0381458 | A1 | 12/2020 | Yang et al. |
| 2021/0166645 | A1 | 6/2021 | Li et al. |
| 2021/0193013 | A1 | 6/2021 | Xu et al. |
| 2021/0193768 | A1 | 6/2021 | Song et al. |
| 2021/0272499 | A1 | 9/2021 | Shen et al. |
| 2021/0295773 | A1 | 9/2021 | Osame et al. |
| 2021/0359054 | A1 | 11/2021 | Gao et al. |
| 2021/0376026 | A1 | 12/2021 | Mou et al. |
| 2022/0077244 | A1 | 3/2022 | Wang et al. |
| 2022/0140039 | A1 | 5/2022 | Mou et al. |
| 2022/0238630 | A1 | 7/2022 | Yang et al. |
| 2022/0310757 | A1 | 9/2022 | Li |
| 2022/0367596 | A1 | 11/2022 | Chen et al. |
| 2022/0399417 | A1 | 12/2022 | Mou et al. |
| 2023/0225165 | A1 | 7/2023 | Chen et al. |

FOREIGN PATENT DOCUMENTS

| | | |
|---|---|---|
| CN | 102830557 A | 12/2012 |
| CN | 104330933 A | 2/2015 |
| CN | 106252363 A | 12/2016 |
| CN | 106601788 A | 4/2017 |
| CN | 107355917 A | 11/2017 |
| CN | 108288455 A | 7/2018 |
| CN | 109309100 A | 2/2019 |
| CN | 109427820 A | 3/2019 |
| CN | 109841650 A | 6/2019 |
| CN | 109872700 A | 6/2019 |
| CN | 110137236 A | 8/2019 |
| CN | 110767158 A | 2/2020 |
| CN | 210575036 U | 5/2020 |
| CN | 113196160 A | 7/2021 |
| CN | 113410279 A | 9/2021 |
| WO | 2021184307 A1 | 9/2021 |
| WO | 2021189331 A1 | 9/2021 |
| WO | 2021227758 A1 | 11/2021 |

* cited by examiner

DISPLAY PANEL AND DISPLAY DEVICE

CROSS REFERENCE TO RELATED APPLICATION(S)

This application is a Section 371 National Stage Application of International Application No. PCT/CN2022/096245, filed on May 31, 2022, entitled "DISPLAY PANEL AND DISPLAY DEVICE", which claims priority to Chinese Patent Application No. 202111499616.4, filed on Dec. 9, 2021, the contents of which are incorporated herein in its entirety by reference.

TECHNICAL FIELD

The present disclosure relates to a field of display technology, and in particular, to a display panel and a display device.

BACKGROUND

With a development of the times, people constantly put forward a higher requirement for a display performance of a display. For example, at present, a display with a good display effect in a low gray scale is required. In a related art, a gray-scale-brightness change curve of the display may be adjusted according to an HDR10 curve, so as to implement more detailed brightness segmentation in the low gray scale. However, even so, a brightness change corresponding to a gray scale step size in the low gray scale is still large, which may be still difficult to meet a display requirement.

SUMMARY

In view of the above-mentioned problems, the present disclosure provides a display panel and a display device.

According to a first aspect of the present disclosure, a display panel is provided, including:
  a base substrate; and
  a plurality of pixel circuits arranged on the base substrate, wherein at least one of the pixel circuits includes a drive transistor and a first switch transistor;
  wherein the display panel further includes:
  an active layer arranged on the base substrate, wherein the active layer includes a first active portion and a second active portion, the first active portion is configured to form a channel portion of the drive transistor, and the second active portion is configured to form a second electrode connection portion of the first switch transistor; and
  a first conductive layer arranged on a side of the active layer away from the base substrate,
  wherein the first conductive layer includes a first conductive portion, a portion of the first conductive portion is configured to form a gate electrode of the drive transistor, and another portion of the first conductive portion is electrically connected to the second active portion, and
  a channel length of the channel portion of the drive transistor is greater than a channel width of the channel portion of the drive transistor.

According to embodiments of the present disclosure, the display panel further includes: a second conductive layer arranged on a side of the first conductive layer away from the base substrate, and
  wherein the second conductive layer includes a second conductive portion, the second conductive portion is electrically connected to the second active portion and the first conductive portion, a size of the second conductive portion in a first direction is less than a channel length of the channel portion of the drive transistor, wherein the first direction includes a direction pointing from a first electrode of the drive transistor to a second electrode of the drive transistor.

According to embodiments of the present disclosure, the first conductive layer further includes a first gate line, and the first gate line is electrically connected to a gate electrode of the first switch transistor;
  the first conductive portion includes a first side and a second side that are arranged in the first direction, and the second conductive portion includes a third side and a fourth side that are arranged in the first direction;
  wherein an orthographic projection of a line where the first side is located on the base substrate is located on a side of an orthographic projection of the third side on the base substrate away from an orthographic projection of the fourth side on the base substrate, and an orthographic projection of a line where the second side is located on the base substrate is located on a side of the orthographic projection of the third side on the base substrate towards the orthographic projection of the fourth side on the base substrate.

According to embodiments of the present disclosure, the orthographic projection of the line where the second side is located on the base substrate is located on a side of the orthographic projection of the fourth side on the base substrate away from the orthographic projection of the third side on the base substrate.

According to embodiments of the present disclosure, the at least one of the pixel circuits further includes a storage capacitor, the second conductive layer further includes a third conductive portion configured to form the storage capacitor, and the third conductive portion includes a fifth side and a sixth side that are arranged in the first direction;
  wherein an orthographic projection of the fifth side on the base substrate is located on a side of an orthographic projection of the sixth side on the base substrate away from an orthographic projection of the second side on the base substrate, and the orthographic projection of the sixth side on the base substrate is located on a side of an orthographic projection of the first side on the base substrate towards the orthographic projection of the second side on the base substrate.

According to embodiments of the present disclosure, the second conductive layer further includes a data line and a fourth conductive portion; and
  the fourth conductive portion is configured to form a first electrode of the first switch transistor, and an orthographic projection of the fourth conductive portion on the base substrate partially overlaps with an orthographic projection of the data line on the base substrate.

According to embodiments of the present disclosure, the first conductive layer further includes a first gate line and a second gate line, and the first gate line is electrically connected to a gate electrode of the first switch transistor and the second gate line;
  an orthographic projection of the first gate line on the base substrate is located on a side of an orthographic projection of the second gate line on the base substrate close to an orthographic projection of the drive transistor on the base substrate; and
  an orthographic projection of the fourth conductive portion on the base substrate is located between the orthographic projection of the first gate line on the base substrate and the orthographic projection of the second gate line on the base substrate.

According to embodiments of the present disclosure, the display panel further includes a plurality of pixel cells, and at least one of the pixel cells includes a plurality of pixel circuits, and
wherein in the at least one of the pixel cells, first electrodes of drive transistors of the plurality of pixel circuits are electrically connected to each other.

According to embodiments of the present disclosure, the at least one of the pixel circuits further includes a second switch transistor, and
wherein in the at least one pixel cell, first electrodes of second switch transistors of the plurality of pixel circuits are electrically connected to each other.

According to embodiments of the present disclosure, at least one group of adjacent pixel circuits meet:
X<Y;
wherein the X represents: a difference between channel lengths of drive transistors in the adjacent pixel circuits; and the Y represents: a difference between channel widths of drive transistors in the adjacent pixel circuits.

According to embodiments of the present disclosure, the plurality of pixel circuits include a first pixel circuit, a second pixel circuit and a third pixel circuit;
wherein the first pixel circuit, the second pixel circuit and the third pixel circuit are electrically connected to light-emitting devices of different colors, respectively, and the first pixel circuit is electrically connected to a red light-emitting device; and
a sum of a channel area of a drive transistor in the second pixel circuit and a channel area of a drive transistor in the third pixel circuit is less than a channel area of a drive transistor in the first pixel circuit.

According to embodiments of the present disclosure, the plurality of pixel circuits include a first pixel circuit, a second pixel circuit, a third pixel circuit and a fourth pixel circuit, wherein the first pixel circuit, the second pixel circuit, the third pixel circuit and the fourth pixel circuit are electrically connected to light-emitting devices of different colors, respectively, and the second pixel circuit is electrically connected to a white light-emitting device; and
a width-to-length ratio of a channel portion of a drive transistor in each of the first pixel circuit, the third pixel circuit and the fourth pixel circuit is greater than a width-to-length ratio of a channel portion of a drive transistor in the second pixel circuit.

According to embodiments of the present disclosure, the plurality of pixel circuits include a first pixel circuit, a second pixel circuit, a third pixel circuit and a fourth pixel circuit,
wherein the first pixel circuit, the second pixel circuit, the third pixel circuit and the fourth pixel circuit are electrically connected to light-emitting devices of different colors, respectively, and the first pixel circuit is electrically connected to a red light-emitting device; and
a width-to-length ratio of a drive transistor in each of the second pixel circuit, the third pixel circuit and the fourth pixel circuit is less than a width-to-length ratio of a drive transistor in the first pixel circuit.

According to embodiments of the present disclosure, drive transistors of the plurality of pixel circuits have a same channel length.

According to embodiments of the present disclosure, drive transistors of at least two pixel circuits have different channel lengths.

According to embodiments of the present disclosure, a width-to-length ratio of the channel portion of the drive transistor is greater than or equal to 1/5 and less than or equal to 25/12.

According to embodiments of the present disclosure, the display panel further includes a gate drive circuit;
wherein a channel length of at least some transistors in the gate drive circuit is less than or equal to a channel width of the at least one transistor in the gate drive circuit.

According to embodiments of the present disclosure, an orthographic projection of a portion of the first conductive portion electrically connected to the second active portion on the base substrate overlaps with an orthographic projection of the second active portion on the base substrate.

According to embodiments of the present disclosure, a width of each of the first gate line and the second gate line is less than the channel length of the drive transistor.

According to embodiments of the present disclosure, a channel width-to-length ratio of each of the first switch transistor and the second switch transistor is greater than a channel width-to-length ratio of the drive transistor.

According to a second aspect of the present disclosure, a display device is provided, including the display panel as described above.

BRIEF DESCRIPTION OF THE DRAWINGS

The above contents and other objectives, features, and advantages of the present disclosure will be clearer through the following description of embodiments of the present disclosure with reference to accompanying drawings, in which.

DETAILED DESCRIPTION OF EMBODIMENTS

Figure 1:
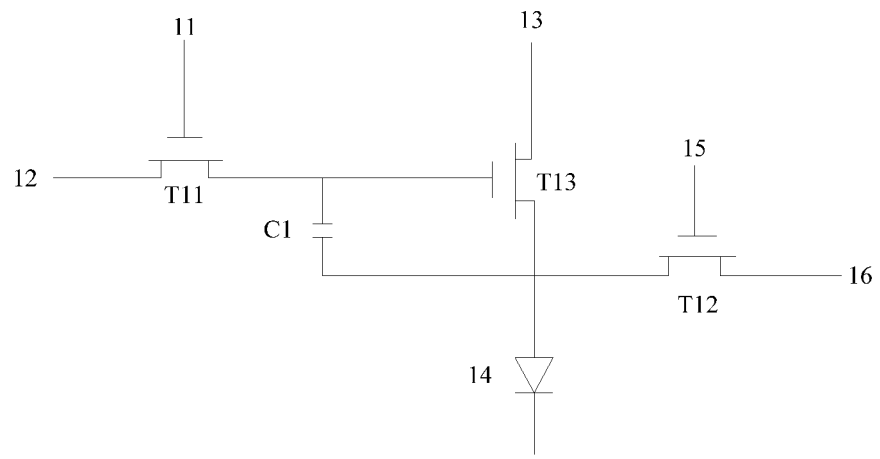
FIG. 1 schematically shows an equivalent circuit diagram of a pixel circuit in an example.

In order to make the purposes, technical solutions and advantages of embodiments of the present disclosure clearer, the technical solutions in embodiments of the present disclosure will be clearly and completely described with reference to accompanying drawings in embodiments of the present disclosure. Obviously, the described embodiments are some, but not all, of embodiments of the present disclosure. Based on the described embodiments of the present disclosure, all other embodiments obtained by those skilled in the art without creative efforts fall within the scope of protection of the present disclosure.

It should be noted that in the accompanying drawings, a size and a relative size of an element may be enlarged for the purpose of clarity and/or description. In this way, the size and the relative size of each element need not be limited to a size and a relative size shown in the drawings. In the specification and drawings, the same or similar reference numerals indicate the same or similar components.

When an element is described to be "on" another element, "connected to" another element or "combined to" another element, the element may be directly on the other element, directly connected to the other element or directly combined to the other element, or there may be an intermediate element therebetween. However, when an element is described to be "directly on" another element, "directly connected to" another element or "directly connected to" another element, there may no intermediate element therebetween. Other terms and/or expressions used to describe a relationship between elements should be interpreted in a similar way, for example, "between" versus "directly between", "adjacent" versus "directly adjacent" or "on" versus "directly on", etc. In addition, a term "connection" may refer to a physical connection, an electrical connection, a communication connection and/or a fluid connection. In addition, an X axis, a Y axis and a Z axis are not limited to three axes of a rectangular coordinate system, and may be explained in a broader sense. For example, the X, Y, and Z axes may be perpendicular to each other, or may represent different directions that are not perpendicular to each other. For the purpose of the present disclosure, "at least one of X, Y and Z" and "at least one selected from a group consisting of X, Y and Z" may be interpreted as X only, Y only, Z only, or any combination of two or more of X, Y and Z, such as XYZ, XYY, YZ and ZZ. As used herein, a term "and/or" includes any combination and all combinations of one or more of related items listed.

It should be noted that although terms "first", "second", etc. may be used here to describe various parts, components, elements, regions, layers and/or portions, the parts, components, elements, regions, layers and/or portions should not be limited by the terms. Instead, the terms are used to distinguish a part, component, element, region, layer and/or portion from another. Therefore, for example, a first component, a first component, a first element, a first region, a first layer and/or a first portion discussed below may be referred to as a second component, a second component, a second element, a second region, a second layer and/or a second portion without departing from the teaching of the present disclosure.

For the convenience of description, spatial relationship terms, such as "up", "down", "left", "right", etc., may be used here to describe a relationship between a element or feature and another element or feature as shown in the drawings. It should be understood that the spatial relationship terms are intended to cover other different orientations of an apparatus in use or operation other than those described in the drawings. For example, when the apparatus in the drawings is reversed, a element described to be located "under" or "below" another element or feature may be oriented to be located "on" or "above" the other element or feature.

It should be understood by those skilled in the art that in this paper, unless otherwise indicated, an expression "thickness" refers to a size of a surface of each film layer arranged perpendicular to a display panel, that is, a size in a light-emitting direction of the display panel.

In this paper, unless otherwise indicated, an expression "patterning process" generally includes steps such as a photoresist coating, an exposure, a development, an etching, a photoresist stripping, etc. An expression "a patterning process" refers to a process of forming a patterned layer, part, component, etc. by using a mask.

It should be noted that an expression "same layer" or "same layer setting" or a similar expression refers to a layer structure formed by forming a film layer for formation of a specific pattern through a same film forming process, and then performing a patterning process on the film layer using a mask. According to different specific patterns, a patterning process may include a plurality of exposure, development or etching processes. The specific patterns in the formed layer structure may be continuous or discontinuous, and they may also be located at different heights or have different thicknesses.

In this paper, unless otherwise indicated, an expression "electrical connection" may mean that two parts or elements are directly electrically connected to each other, for example, a part or element A is in direct contact with a part or element B, and an electrical signal may be transmitted therebetween; or may also mean that two parts or elements are electrically connected to each other through a conductive medium such as a conducting wire, for example, a part or element A is electrically connected to a part or element B through a conducting wire so as to transmit an electrical signal between the two parts or elements; or may also mean that two components or elements are electrically connected to each other through at least one electronic component, for example, a part or element A is electrically connected to a component or element B through at least one thin film transistor so as to transmit an electrical signal between the two parts or elements.

In a comparative example, a display panel includes a plurality of pixel cells, each pixel cell includes a plurality of sub-pixels, and each sub-pixel includes a light-emitting device and a pixel circuit used to provide a drive current to the light-emitting device. FIG. 1 schematically shows an equivalent circuit diagram of a pixel circuit in an example. As shown in FIG. 1, in the example, the pixel circuit may include a first switch transistor T11, a second switch transistor T12, a drive transistor T13 and a storage capacitor C1.

A gate electrode of the first switch transistor T11 is electrically connected to a first gate line 11, a first electrode of the first switch transistor T11 is electrically connected to a data line 12, a second electrode of the first switch transistor T11 is electrically connected to a gate electrode of the drive transistor T13, a first electrode of the drive transistor T13 is electrically connected to a first power line 13, a second electrode of the drive transistor T13 is electrically connected to a second polar plate of the storage capacitor C1, a second electrode of the second switch transistor T12 and a light-emitting device 14, a gate electrode of the second switch transistor T12 is electrically connected to a second gate line 15, and a first electrode of the second switch transistor T12 is electrically connected to a reference signal line 16.

In this example, a structure of the drive transistor T13 directly affects a drive signal provided to the light-emitting device 14. Therefore, a structural parameter of the drive transistor T13 is relatively sensitive. In order to ensure that the light-emitting device 14 may implement a desired light-emitting effect, a design of the drive transistor T13 is generally prudent, and the drive transistor T13 generally uses a more general design method, that is, the drive transistor T13 may use a design method in which a channel length is greater than a channel width.

Figure 2:
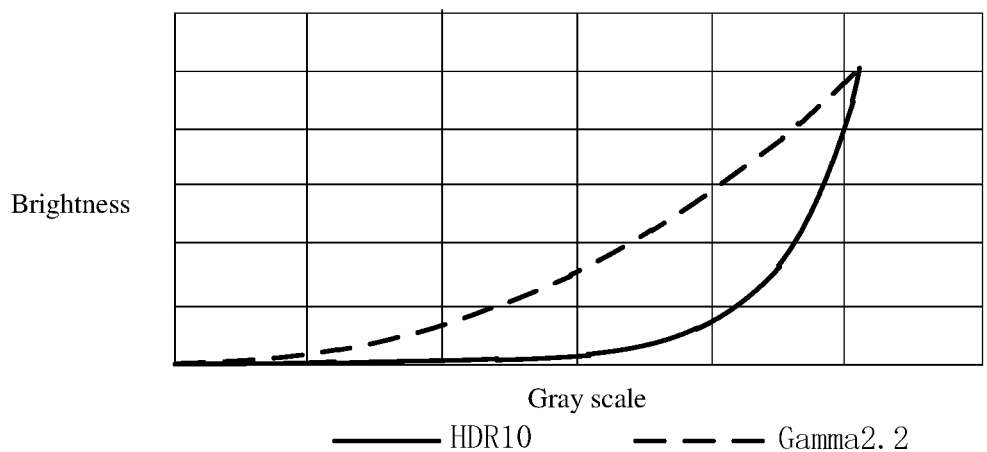
FIG. 2 schematically shows a schematic diagram of an HDR10 curve and a Gamma2.2 curve.

In order to improve a display effect in a low gray scale, in this example, a gray-scale-brightness change curve of the display panel is adjusted according to an HDR10 curve, so that a more detailed brightness segmentation in a low gray scale range may be implemented, thereby improving the display effect in the low gray scale. FIG. 2 schematically shows a schematic diagram of a gray-scale-brightness change curve before adjustment. FIG. 2 schematically shows a schematic diagram of an HDR10 curve and a Gamma2.2 curve. It can be clearly seen from FIG. 2 that compared with the Gamma2.2 curve, the HDR10 curve is in a lower gray-scale range, and a brightness change amplitude in a gray scale step size is smaller, so that more detailed brightness segmentation may be implemented and a gray scale expansion effect may be improved. However, even so, a brightness change corresponding to a gray scale step size in the low gray scale is still large, which may be still difficult to meet a display requirement.

Figure 3:
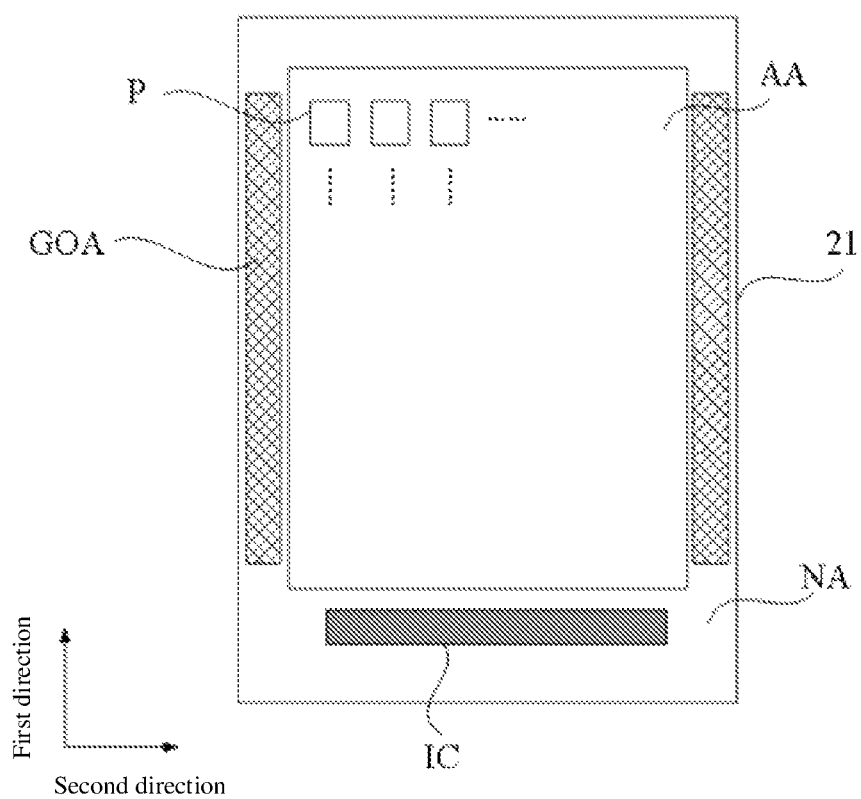
FIG. 3 schematically shows a plan view of a display panel according to embodiments of the present disclosure.

In view of this, the embodiments of the present disclosure provide a display panel. FIG. 3 schematically shows a plan view of a display panel according to embodiments of the present disclosure. As shown in FIG. 3, the display panel includes: a base substrate 21 and a plurality of pixel circuits arranged on the base substrate 21. The display panel may be divided into a display region AA and a non-display region NA that is located outside the display region AA. In the display region AA, a plurality of pixel cells P are arranged in an array in a first direction and a second direction. The first direction may include a column direction of the display panel, i.e., a vertical direction in FIG. 3, and the second direction may include a row direction of the display panel, i.e., a horizontal direction in FIG. 3.

Figure 4A:
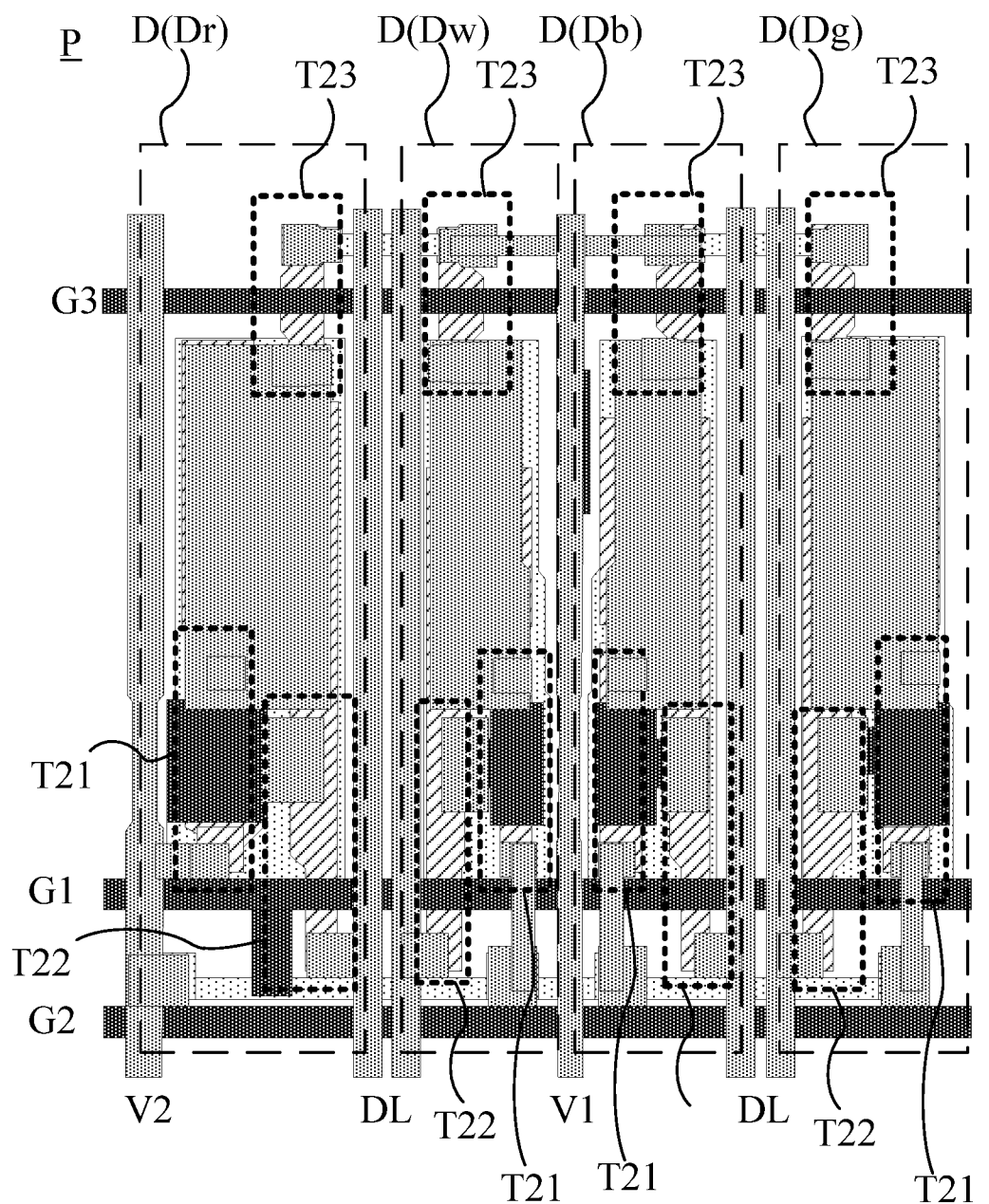
FIG. 4a schematically shows a first plan view of a pixel circuit in a pixel cell according to embodiments of the present disclosure.

FIG. 4a schematically shows a first plan view of a pixel circuit in a pixel cell according to embodiments of the present disclosure. As shown in FIG. 4a, each pixel cell P includes a plurality of sub-pixels. In each pixel cell P, the plurality of sub-pixels have different colors. For example, each pixel cell P includes a red sub-pixel, a green sub-pixel and a blue sub-pixel. For another example, each pixel cell P includes a red sub-pixel, a green sub-pixel, a blue sub-pixel and a white sub-pixel. Each sub-pixel may include the light-emitting device and a pixel circuit D as described above. The pixel circuit D is electrically connected to the light-emitting device to provide a drive signal to the light-emitting device, so that the light-emitting device may emit light. For example, the red sub-pixel includes a first pixel circuit Dr, the white sub-pixel includes a second pixel circuit Dw, the blue sub-pixel includes a third pixel circuit Db, and the green sub-pixel includes a fourth pixel circuit Dg.

Optionally, the light-emitting device may include an Organic Light-Emitting Diode (OLED) or a Micro Light-Emitting Diode (Micro LED), and the pixel circuit may provide a drive current to the organic light-emitting device or the micro light-emitting diode, so that the organic light-emitting device or the micro light-emitting diode may emit light.

In the non-display region NA, a gate drive circuit GOA and a data drive chip IC, etc. are provided. The gate drive circuit GOA and the data drive chip IC may be electrically connected to the pixel circuit through a corresponding gate line and data line, and then provide the pixel circuit with electrical signals such as a scanning signal and a data voltage signal, etc. through the gate line and the data line, so that the pixel circuit may provide the drive signal to the light-emitting device to drive the light-emitting device to emit light.

Figure 4B:
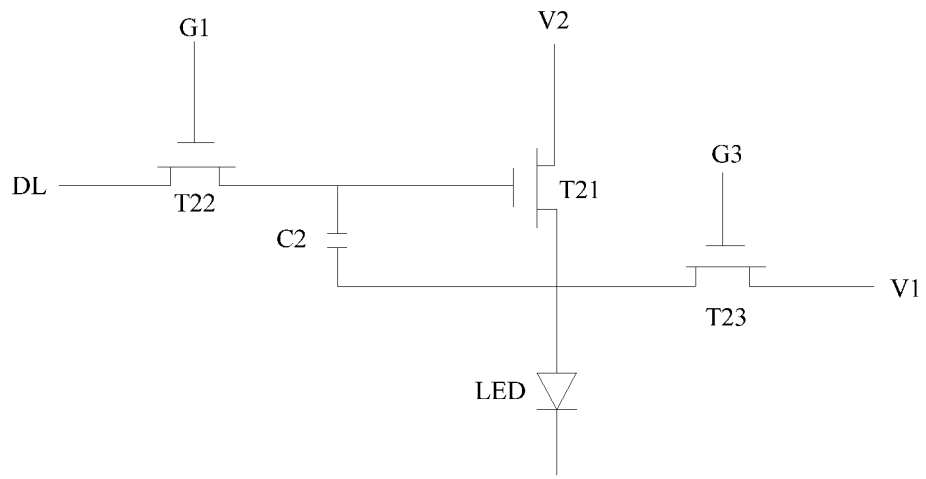
FIG. 4b schematically shows an equivalent circuit diagram of a pixel circuit according to embodiments of the present disclosure.

FIG. 4b schematically shows an equivalent circuit diagram of a pixel circuit according to embodiments of the present disclosure. In combination with FIG. 4a and FIG. 4b, at least one pixel circuit D includes a drive transistor T21 and a first switch transistor T22. In embodiments of the present disclosure, the pixel circuit D may use a 3T1C structure. For example, the pixel circuit D may further include a second switch transistor T23 and a storage capacitor C2 that will be mentioned below. In other words, the pixel circuit D may be composed of three transistors and a storage capacitor.

In embodiments of the present disclosure, the display panel further includes a first gate line G1, a third gate line G3, a data line DL, a reference signal line V1 and a first power line V2. A gate electrode of the first switch transistor T22 is electrically connected to the first gate line G1, a first electrode of the first switch transistor T22 is electrically connected to the data line DL, a second electrode of the first switch transistor T22 is electrically connected to a gate electrode of the drive transistor T21, a first electrode of the drive transistor T21 is electrically connected to the first power line V2, a second electrode of the drive transistor T21 is electrically connected to a second polar plate of the storage capacitor C2, a second electrode of the second switch transistor T23 and the light-emitting device LED, a gate electrode of the second switch transistor T23 is electrically connected to the third gate line G3, and a first electrode of the second switch transistor T23 is electrically connected to the reference signal line V1.

It should be noted that the transistors (e.g., the drive transistor T21 and the first switch transistor T22) used in embodiments of the present disclosure may include a thin film transistor TFT, a field effect transistor or other devices with the same characteristics. Since a source electrode and a drain electrode of the transistors used are symmetrical, no difference exists between the source electrode and the drain electrode of the transistors. In embodiments of the present disclosure, in order to distinguish the source electrode and the drain electrode the transistors, one of the source electrode and the drain electrode is called a first electrode, and the other the source electrode and the drain electrode is called a second electrode. In addition, according to characteristics of the transistors, the transistors may be divided into an N-type transistor and a P-type transistor. In the following embodiments, an N-type transistor is taken as an example for description. When the N-type transistor is used, the first electrode is a source electrode of the N-type transistor, and the second electrode is a drain electrode of the N-type transistor, and when a high level is input into the gate electrode, the source electrode and drain electrode are turned on, while the P-type transistor is the opposite.

In embodiments of the present disclosure, "effective level signal" refers to a signal that may control a conduction of a transistor after being input to a control electrode (that is, a gate electrode of the transistor) of the transistor, and "non-effective level signal" refers to a signal that may control a cut-off of the transistor after being input to the control electrode of the transistor. For the N-type transistor, a high-level signal is the effective level signal, and a low-level signal is the non-effective level signal. For the P-type transistor, a low-level signal is the effective level signal, and a high-level signal is the non-effective level signal. Since the N-type transistor is taken as an example for description in embodiments of the present disclosure, the following takes the effective level signal as the high level signal and the non-effective level signal as the low level signal as an example for description.

Figure 4C:
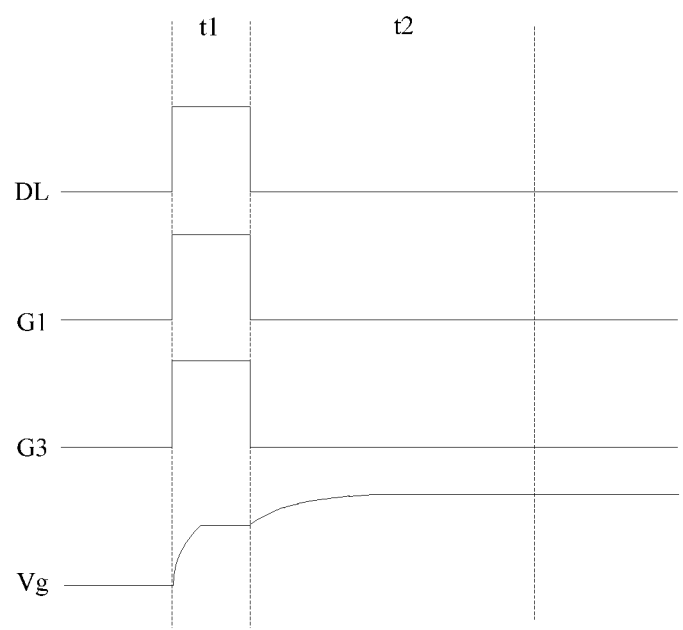
FIG. 4c schematically shows a drive time sequence diagram of a pixel circuit according to embodiments of the present disclosure.

FIG. 4c schematically shows a drive time sequence diagram of a pixel circuit according to embodiments of the present disclosure. In combination with FIG. 4a to FIG. 4c, a working process of the pixel circuit includes at least a data writing stage t1 and a light-emitting stage t2.

At the data writing stage t1, an effective level signal is provided to the first gate line G1 and the third gate line G3. The first switch transistor T22 and the second switch transistor T23 are turned on. The data line DL inputs a data signal to a gate electrode of the drive transistor T21 through the first switch transistor T22 and stores the data signal in the storage capacitor C2. The reference signal line V1 inputs an initial signal to the second electrode of the drive transistor T21 through the second switch transistor T23.

At the light-emitting stage t2: the drive transistor T21 is turned on under an action of the storage capacitor C2. The drive transistor T21 generates a drive current I according to a gate-to-source voltage of the drive transistor T21, and the drive current I flows to the light-emitting device LED to drive the light-emitting device LED to emit light. At the stage, due to a bootstrap effect of the storage capacitor C2, the gate voltage Vg of the drive transistor T21 may be increased accordingly, so that the gate voltage of the drive transistor T21 may remain stable, and then the drive transistor T21 may continue to generate the drive current I to drive the LED to emit light.

Figure 5A:
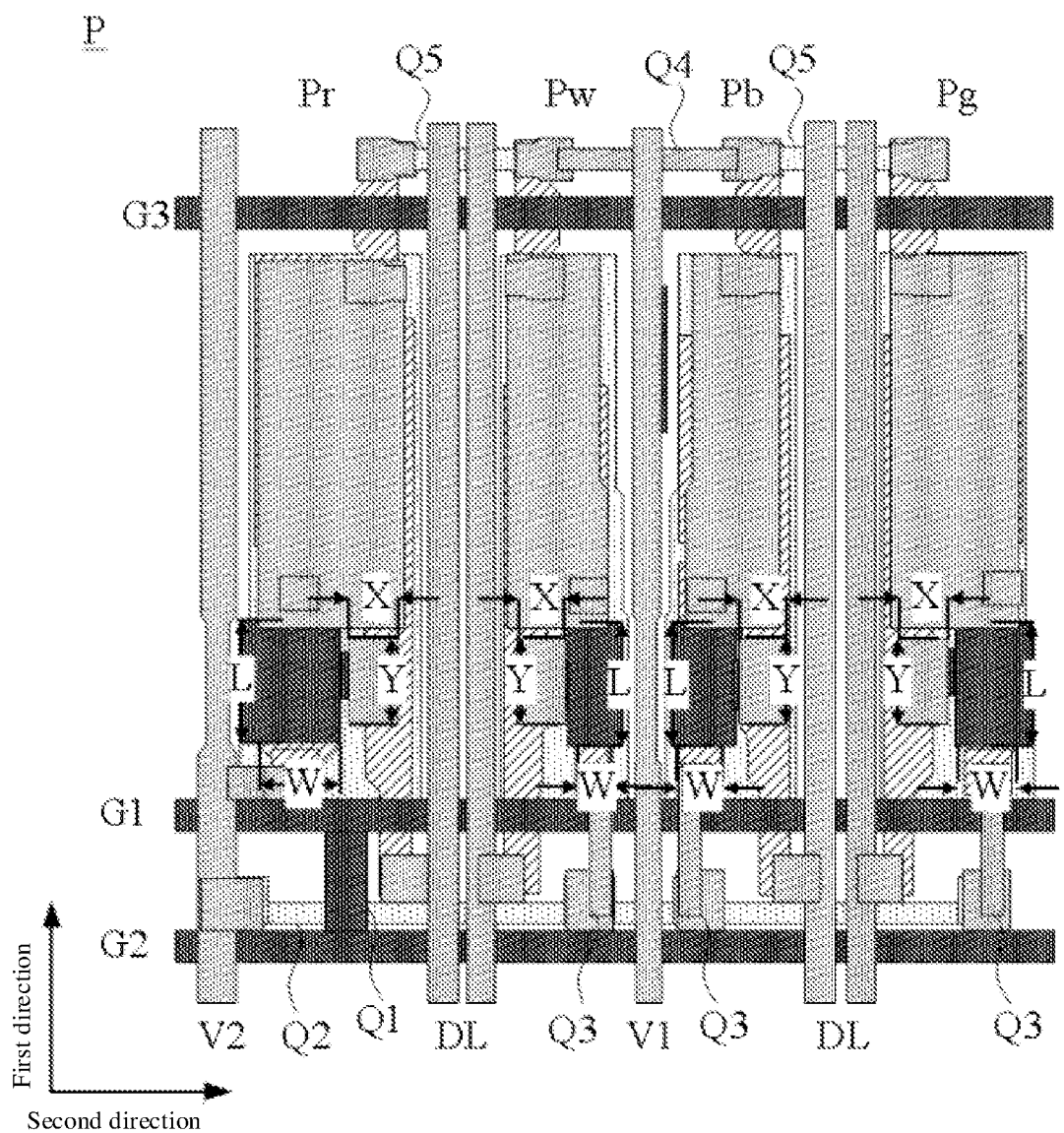
FIG. 5a schematically shows a second plan view of a pixel circuit in a pixel cell according to embodiments of the present disclosure.
Figure 5B:
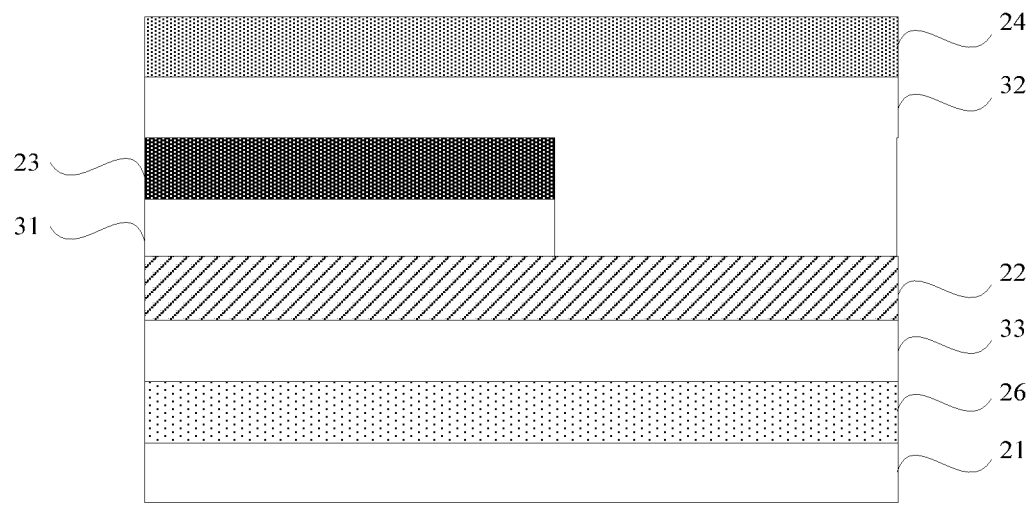
FIG. 5b schematically shows a superposed diagram of each film layer in a display panel in a thickness direction according to embodiments of the present disclosure.
Figure 6A:
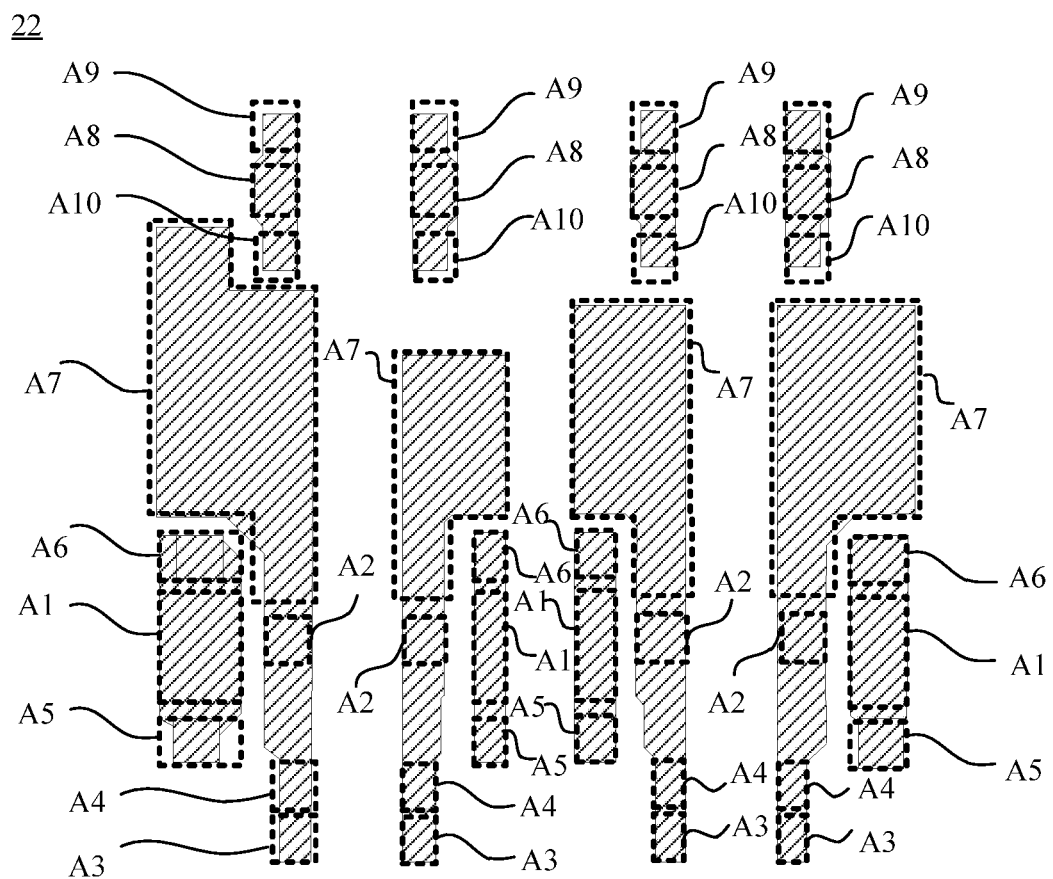
FIG. 6a schematically shows a plan view of an active layer according to embodiments of the present disclosure.
Figure 6B:
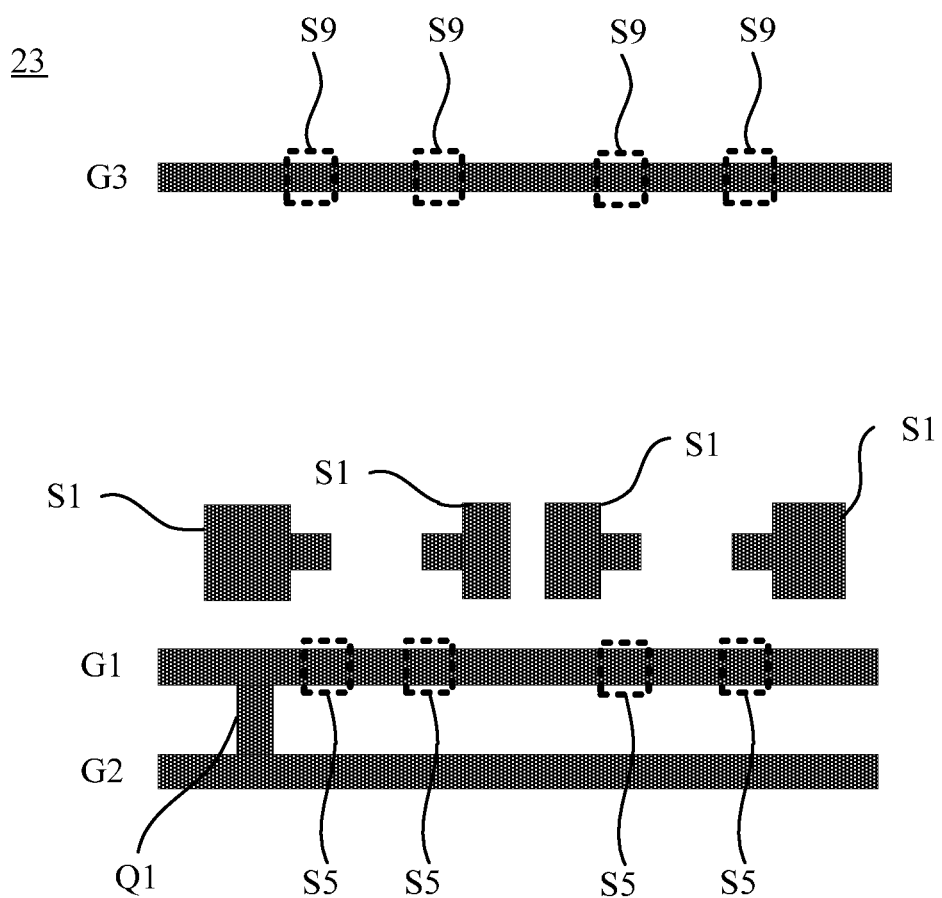
FIG. 6b schematically shows a plan view of a first conductive layer according to embodiments of the present disclosure.

FIG. 5a schematically shows a second plan view of a pixel circuit in a pixel cell according to embodiments of the present disclosure, FIG. 5b schematically shows a superposed diagram of each film layer in a thickness direction of a display panel according to embodiments of the present disclosure, FIG. 6a schematically shows a plan view of an active layer according to embodiments of the present disclosure, and FIG. 6b schematically shows a plan view of a first conductive layer according to embodiments of the present disclosure. In combination with FIG. 4a to FIG. 6b, the display panel further includes: an active layer 22 arranged on the base substrate 21 and a first conductive layer 23 arranged on a side of the active layer 22 away from the base substrate 21. The active layer 22 includes a first active portion A1 and a second active portion A2. The first active portion A1 is used to form a channel portion of the drive transistor T21, and the second active portion A2 is used to form a second electrode connection portion of the first switch transistor T22. The first conductive layer 23 includes a first conductive portion S1, a portion of the first conductive portion S1 is used to form the gate electrode of the drive transistor T21, another portion of the first conductive portion S1 is electrically connected to the second active portion A2, and the second active portion A2 is further electrically connected to the second electrode of the first switch transistor T22, so as to implement an electrical connection between the gate electrode T21 of the drive transistor and the second electrode of the first switch transistor. Optionally, the first conductive portion 51 may partially overlap with the second active portion A2, so as to implement a more compact structure. The details will be described below in detail and will not be repeated here.

In embodiments of the present disclosure, a channel length of the channel portion of the drive transistor T21 is greater than a channel width of the channel portion of the drive transistor T21. As described above, at the light-emitting stage t2, the drive transistor T21 generates the drive current I, and the drive current $I=W/2L \times \mu \times Cox \times [(Vgs-Vth)]^2$, where W is a channel width of the drive transistor T21, L is a channel length of the drive transistor T21, W/L is a width-to-length ratio of a channel of the drive transistor T21, u is a mobility, Cox is a capacitance per unit area, Vgs is a gate-to-source voltage of the drive transistor T21, and Vth is a threshold voltage of the drive transistor T21. In embodiments of the present disclosure, the channel length L of the drive transistor T21 is greater than the channel width W of the drive transistor T21. Compared with a solution in which the channel width W of the drive transistor T21 is greater than the channel length L of the drive transistor T21 in the above-mentioned example, the drive transistor T21 according to embodiments of the present disclosure has a less width-to-length ratio W/L, the drive current I is more detailed with a change of a gray scale, and the gray scale expansion effect may be better.

It should be noted that in embodiments of the present disclosure, the channel length L may refer to: a size of the channel portion of the drive transistor in a direction pointing from a first electrode to a second electrode. Accordingly, the channel width W may refer to a size of the channel portion of the transistor in a direction intersecting a direction in which the channel length L is located.

The specific structure of the display panel according to embodiments of the present disclosure will be further described below with reference to FIG. 4a to FIG. 9.

In some specific embodiments, the display panel further includes: a second conductive layer 24 arranged on a side of the first conductive layer 23 away from the base substrate 21.

In embodiments of the present disclosure, a first insulating layer 31 is provided between the first conductive layer 23 and the active layer 22, and the first insulating layer 31 insulatively spaces the first conductive layer 23 from the active layer 22. The first insulating layer 25 and the first conductive layer 23 may be made from a same mask. In other words, a pattern of the first insulating layer 31 may be the same as a pattern of the first conductive layer 23. For example, a first insulating material layer and a first conductive material layer may be first formed on the side of the active layer 22 away from the base substrate 21, and then the first insulating material layer and the first conductive material layer may be patterned simultaneously by using a mask, so as to obtain the first insulating layer 31 and the first conductive layer 23 that have the same pattern.

In embodiments of the present disclosure, since the pattern of the first insulating layer 31 is consistent with the pattern of the first conductive layer 23, the first insulating layer 31 is generally not provided with a via hole. Therefore, in embodiments of the present disclosure, a transfer between the second active portion A2 and the first conductive portion S1 may be implemented through a second conductive portion S2.

Figure 6C:
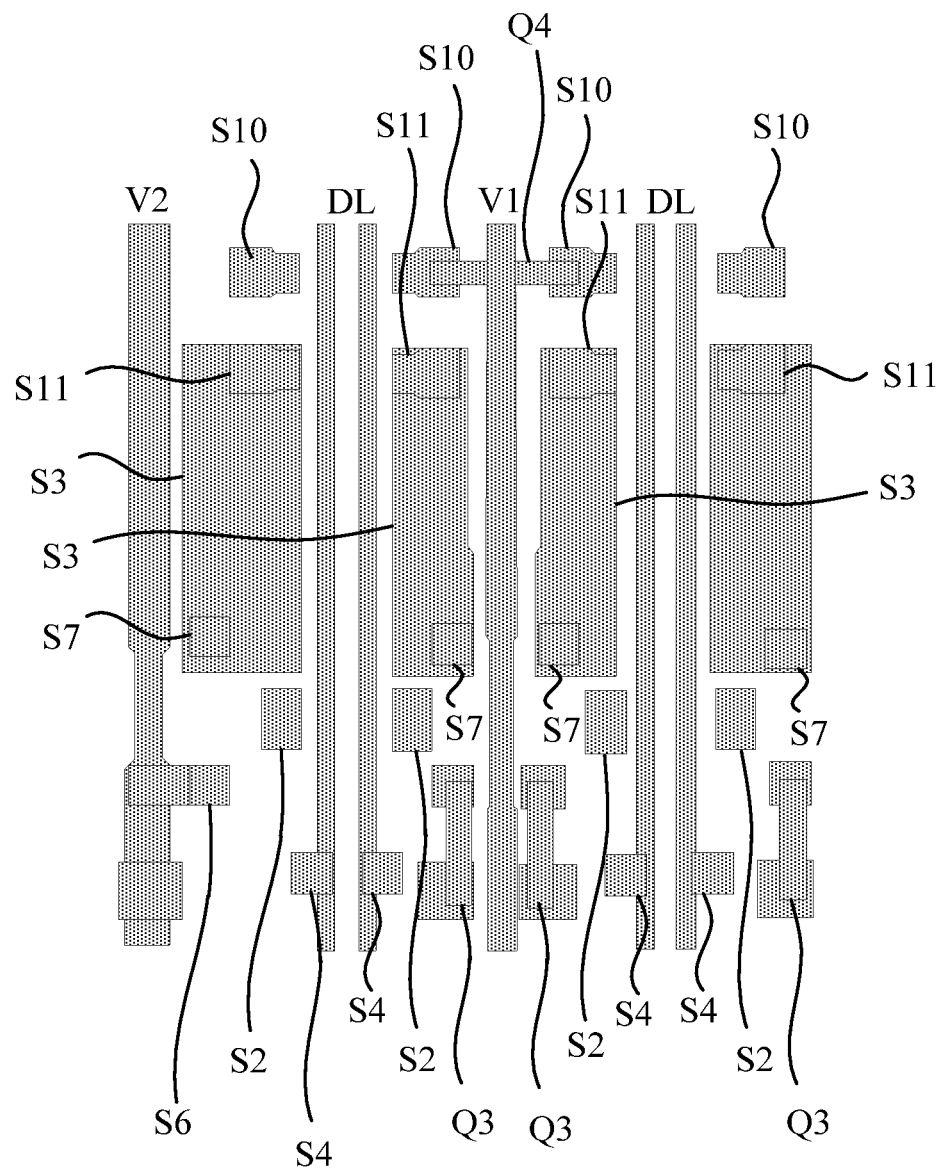
FIG. 6c schematically shows a plan view of a second conductive layer according to embodiments of the present disclosure.

FIG. 6c schematically shows a plan view of a second conductive layer according to embodiments of the present disclosure. As shown in FIG. 6c, specifically, the second conductive layer 24 includes the second conductive portion S2. The second conductive portion S2 is electrically connected to the second active portion A2 and the first conductive portion S1, so as to implement the transfer between the second active portion A2 and the first conductive portion S1.

In embodiments of the present disclosure, a second insulating layer 32 is provided between the first conductive layer 23 and the second conductive layer 24, and between the active layer 22 and the second conductive layer 24. The second insulating layer 32 insulatively spaces the first conductive layer 23, the second conductive layer 24 and the active layer 22 from each other.

Figure 6D:
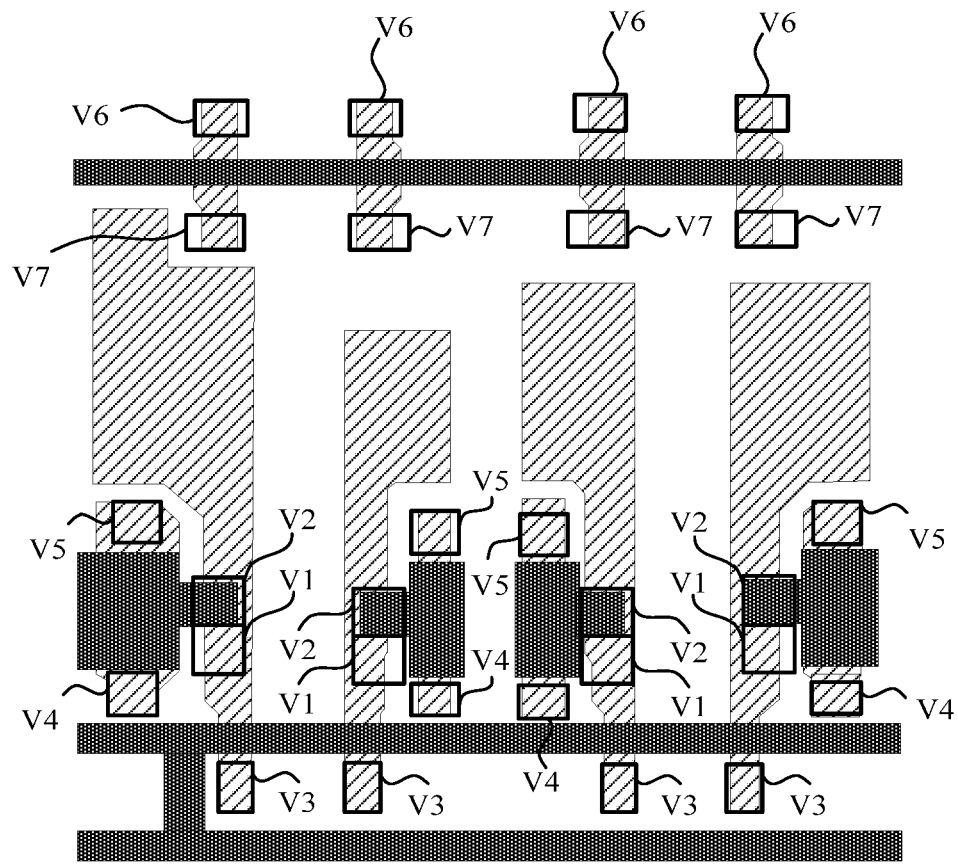
FIG. 6d schematically shows a plan view of some via holes according to embodiments of the present disclosure.

FIG. 6d schematically shows a plan view of some via holes according to embodiments of the present disclosure. As shown in FIG. 6d, the second insulating layer 32 is provided with a first via hole V1 penetrating through the second insulating layer 32. An orthographic projection of the second active portion A2 on the base substrate 21 partially overlaps with an orthographic projection of the second conductive portion S2 on the base substrate 21, and in the overlapping region, the second active portion A2 is electrically connected to the second conductive portion S2 through the first via hole V1. The second insulating layer 32 is further provided with a second via hole V2 penetrating through the second insulating layer 32. An orthographic projection of the first conductive portion S1 on the base substrate 21 partially overlaps with an orthographic projection of the second conductive portion S2 on the base substrate 21, and in the overlapping region, the first conductive portion S1 is electrically connected to the second conductive portion S2 through the second via hole V2. Optionally, the first via hole V1 and the second via hole V2 may be formed into an integrated structure.

Please continue to refer to FIG. 5a. In embodiments of the present disclosure, a portion of the second conductive portion S2 electrically connected to the second active portion A2 and a portion of the second conductive portion S2 electrically connected to the first conductive portion S1 are arranged in the first direction. Optionally, a size Y of the second conductive portion S2 in the first direction is greater than a size X of the second conductive portion S2 in the second direction. For example, a shape of the second conductive portion S2 may be approximately a rectangle. A corner of the rectangle may be either a right angle or an arc corner. The details may be determined according to actual needs, and will not be limited here.

In embodiments of the present disclosure, the channel length L of the channel portion of the drive transistor T21 is greater than the size Y of the second conductive portion S2 in the first direction. The first direction includes a direction pointing from the first electrode of the drive transistor T21 to the second electrode of the drive transistor T21. The channel length L of the drive transistor T21 is greater than the size Y of the second conductive portion S2 in the first direction, so that the channel length L of the drive transistor T21 may be larger, which may be conducive to reducing a width-to-length ratio of the drive transistor T21.

In some specific embodiments, a width-to-length ratio of the channel portion of the drive transistor T21 is greater than or equal to 3/10 and less than or equal to 25/12. In this way, the width-to-length ratio of the drive transistor T21 may reach a desired range. For example, the channel width W of the drive transistor T21 may be in a range of 6 μm to 25 μm, including a boundary value, and the channel length L of the channel portion of the drive transistor T21 may be a range of more than 12 μm. For example, as shown in FIG. 5a, the channel length L of the channel portion of the drive transistor T21 may reach a range of more than 20 μm, so that the channel portion of the drive transistor T21 may be approximately a narrow structure, which may better improve the gray scale expansion effect.

In some specific embodiments, the first conductive layer 23 further includes the first gate line G1, and the first gate line G1 is electrically connected to the gate electrode of the first switch transistor T22. In embodiments of the present disclosure, the first gate line G1 extends in the second direction, and the first gate line G1 and the gate electrode of the first switch transistor T22 may be formed into an integrated structure.

Figure 7A:
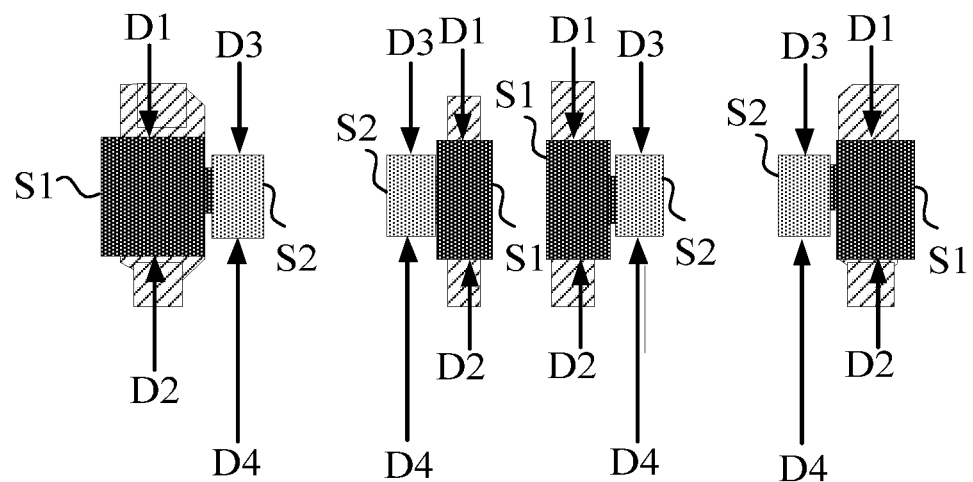
FIG. 7a schematically shows a plan view of a drive transistor and a second conductive portion according to embodiments of the present disclosure FIG. 7b schematically shows a plan view of a drive transistor and a third conductive portion according to embodiments of the present disclosure.

FIG. 7a schematically shows a plan view of a drive transistor and a second conductive portion according to embodiments of the present disclosure. As shown in FIG. 7a, the first conductive portion S1 includes a first side D1 and a second side D2 that are arranged in the first direction, and the second conductive portion S2 includes a third side D3 and a fourth side D4 that are arranged in the first direction. An orthographic projection, on the base substrate 21, of a line where the first side D1 is located is located on a side of an orthographic projection of the third side D3 on the base substrate 21 away from an orthographic projection of the fourth side D4 on the base substrate 21, and an orthographic projection, on the base substrate 21, of a line where the second side D2 is located is located on a side of the orthographic projection of the third side D3 on the base substrate 21 towards the orthographic projection of the fourth side D4 on the base substrate 21.

As shown in FIG. 7a, the first side D1 is located above the third side D3, and a distance between the first side D1 and the third side D3 may be determined according to actual needs. For example, the pixel circuit D further includes the storage capacitor C2 that will be mentioned below. In combination with FIG. 5a to FIG. 7a, a region above the first side D1 is used to provide the storage capacitor C2. A size of the region affects an effective area of the storage capacitor C2, and thus affects a size of the storage capacitor C2. Therefore, a distance between the first side D1 and the third side D3 should not be too large, so as to avoid affecting the effective area of the storage capacitor C2. It should be noted that the distance between the first side D1 and the third side D3 may refer to a vertical distance therebetween, and the effective area of the storage capacitor C2 may refer to an overlapping area between two polar plates arranged opposite to each other in the storage capacitor C2.

In some specific embodiments, the orthographic projection, on the base substrate 21, of the line where the second side D2 is located is located on a side of the orthographic projection of the fourth side D4 on the base substrate 21 away from the orthographic projection of the third side D3 on the base substrate 21.

As shown in FIG. 7a, the second side D2 is located below the fourth side D4, and a distance between the second side D1 and the fourth side D4 may be determined according to actual needs. For example, in combination with FIG. 5a and FIG. 7a, a region below the second side D1 is used to provide the first gate line G1, and an orthographic projection of a fifth active portion A5 on the base substrate 21 is located between an orthographic projection of the first gate line G1 on the base substrate 21 and the orthographic projection of the first conductive portion S1 on the base substrate 21. Therefore, the distance between the second side D1 and the fourth side D4 should not be too large, so as to avoid affecting settings of the fifth active portion A5 and the first gate line G1. It should be noted that the distance between the first side D1 and the third side D3 may refer to a vertical distance therebetween.

Figure 7B:
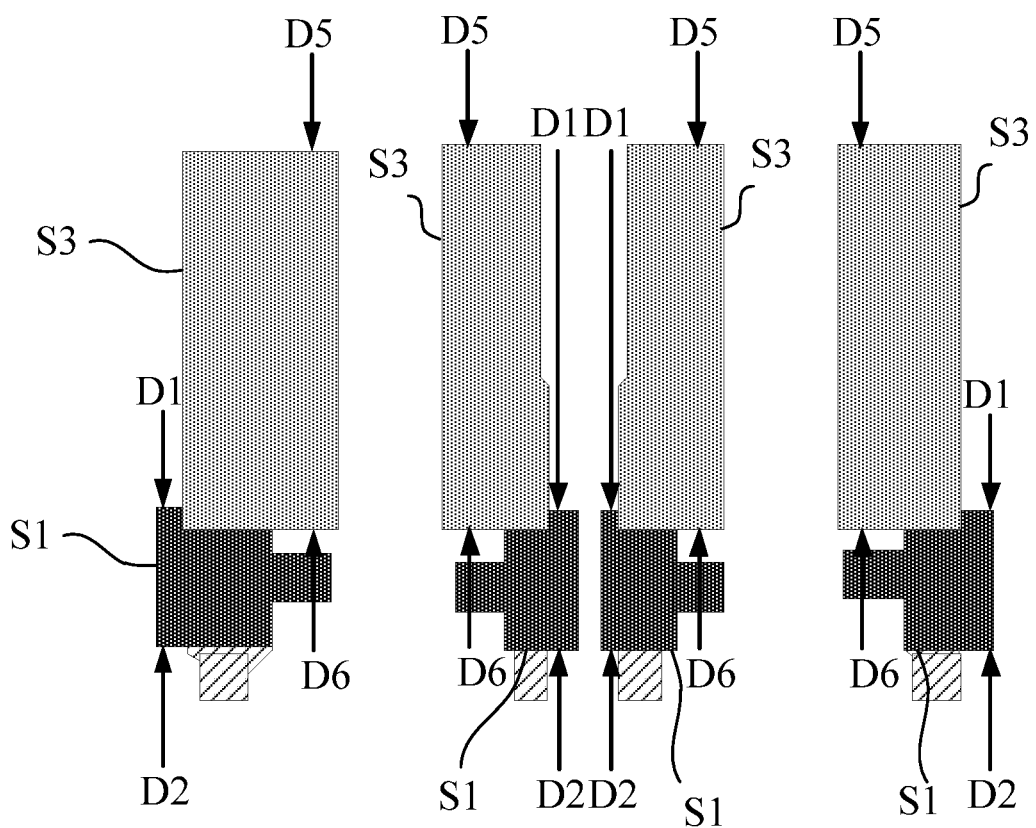

In some specific embodiments, the at least one pixel circuit D further includes the storage capacitor C2, and the second conductive layer 24 further includes a third conductive portion S3 used to form the storage capacitor C2. FIG. 7b schematically shows a plan view of a drive transistor and a third conductive portion according to embodiments of the present disclosure. As shown in FIG. 7b, the third conductive portion S3 includes a fifth side D5 and a sixth side D6 that are arranged in the first direction. An orthographic projection of the fifth side D5 on the base substrate 21 is located on a side of an orthographic projection of the sixth side D6 on the base substrate 21 away from an orthographic projection of the second side D2 on the base substrate 21, and the orthographic projection of the sixth side D6 on the base substrate 21 is located on a side of an orthographic projection of the first side D1 on the base substrate 21 towards the orthographic projection of the second side D2 on the base substrate 21.

Figure 8:
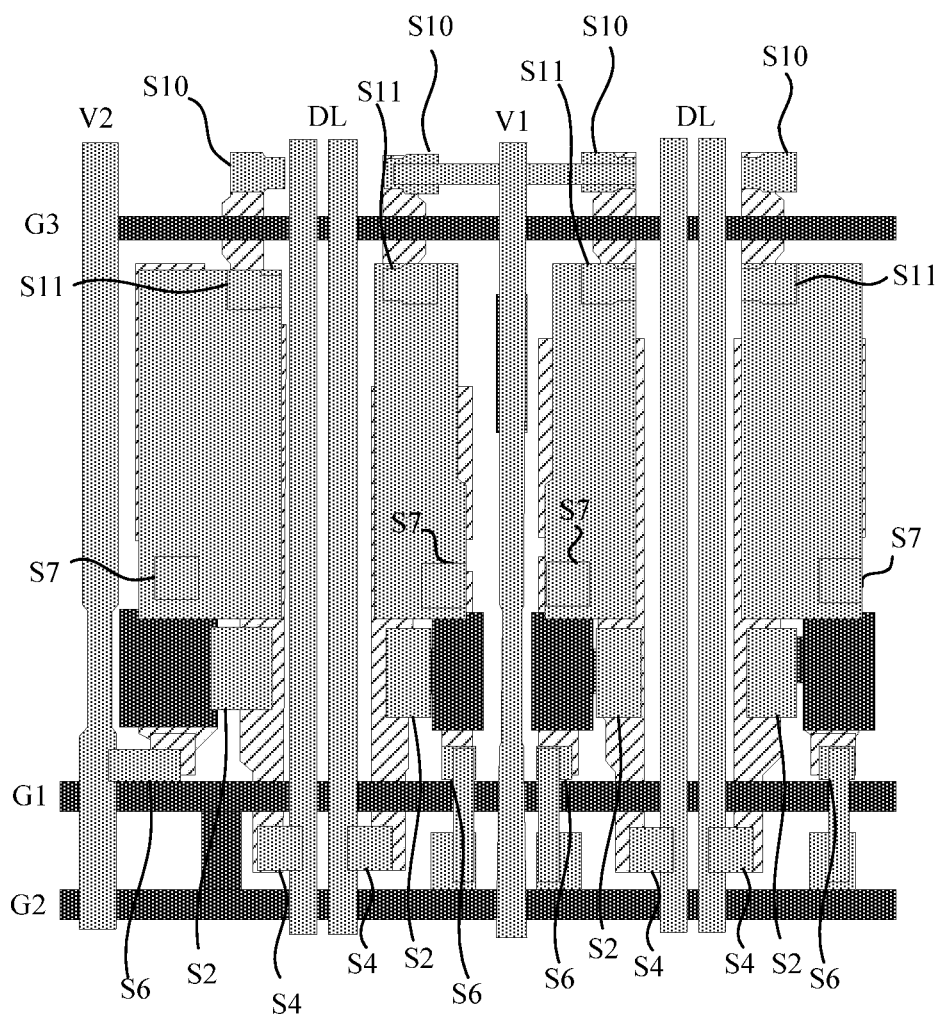
FIG. 8 schematically shows a third plan view of a pixel circuit in a pixel cell according to embodiments of the present disclosure.

FIG. 8 schematically shows a third plan view of a pixel circuit in a pixel cell according to embodiments of the present disclosure. In combination with FIG. 5a to FIG. 8, in some specific embodiments, the first conductive layer 23 further includes a fifth conductive portion S5, and the second conductive layer 24 further includes: a fourth conductive portion S4, a sixth conductive portion S6, and a seventh conductive portion S7. The fifth conductive portion S5 is used to form the gate electrode of the first switch transistor T22, the fourth conductive portion S4 is used to form the first electrode of the first switch transistor T22, the sixth conductive portion S6 is used to form the first electrode of the drive transistor T21, and the seventh conductive portion S7 is used to form the second electrode of the drive transistor T21.

In some specific embodiments, the active layer 22 further includes a third active portion A3, a fourth active portion A4, a fifth active portion A5 and a sixth active portion A6. The third active portion A3 is used to form a first electrode connection portion of the first switch transistor T21, the fourth source portion A4 is used to form a channel portion of the first switch transistor T21, the fifth active portion A5 is used to form a first electrode connection portion of the drive transistor T22, and the sixth active portion A6 is used to form a second electrode connection portion of the drive transistor T22.

The first active portion A1 is located between the fifth active portion A5 and the sixth active portion A6, and is directly opposite to a portion of the first conductive portion S1 used to form the gate electrode of the drive transistor T21. An orthographic projection of the third active portion A3 on the base substrate 21 partially overlaps with an orthographic projection of the fourth conductive portion S4 on the base substrate 21, and in the overlapping region, the third active portion A3 is electrically connected to the fourth conductive portion S4 through a third via hole V3 penetrating through the second insulating layer 32. The fourth active portion A4 is located between the second active portion A2 and the third active portion A3, and is directly opposite to the fifth conductive portion S5. An orthographic projection of the fifth active portion A5 on the base substrate 21 at least partially overlaps with an orthographic projection of the sixth conductive portion S6 on the base substrate 21, and in the overlapping region, the fifth active portion A5 is electrically connected to the sixth conductive portion S6 through a fourth via hole V4 penetrating through the second insulating layer 32. An orthographic projection of the sixth active portion A6 on the base substrate 21 at least partially overlaps with an orthographic projection of the seventh conductive portion S7 on the base substrate 21, and in the overlapping region, the sixth active portion A6 is electrically connected to the seventh conductive portion S7 through a fifth via hole V5 penetrating through the second insulating layer 32.

In some specific embodiments, the third conductive portion S3 is used to form a first polar plate of the storage capacitor C2. Optionally, the active layer 22 further includes a seventh active portion A7. An orthographic projection of the seventh active portion A7 on the base substrate 21 partially overlaps with an orthographic projection of the third conductive portion S3 on the base substrate 21. The seventh active portion A7 is used to form the second polar plate of the storage capacitor C2.

Figure 9:
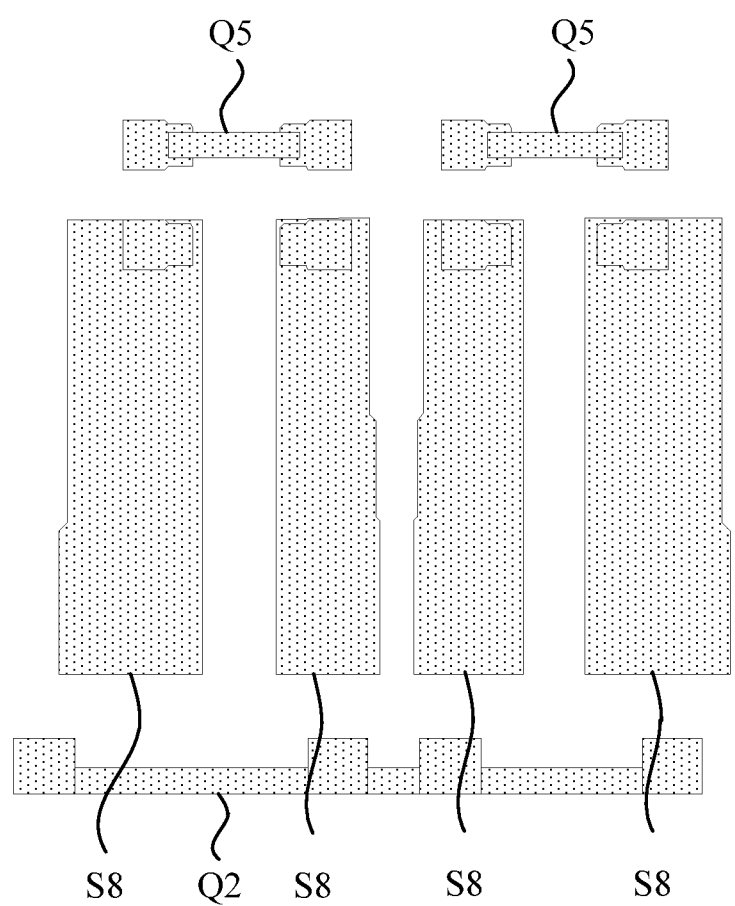
FIG. 9 schematically shows a plan view of a third conductive layer according to embodiments of the present disclosure.

FIG. 9 schematically shows a plan view of a third conductive layer according to embodiments of the present disclosure. As shown in FIG. 9, optionally, the display panel further includes a third conductive layer 26 located on a side of the active layer 22 close to the base substrate 21, and the third conductive layer 26 includes an eighth conductive portion S8. As shown in FIG. 5a to FIG. 9, the orthographic projection of the seventh active portion A7 on the base substrate 21, the orthographic projection of the third conductive portion S3 on the base substrate 21 and an orthographic projection of the eighth conductive portion S8 on the base substrate 21 partially overlap with each other. The third conductive portion S3 is electrically connected to the eighth conductive portion S8, and both the third conductive portion S3 and the eighth conductive portion S8 form the first polar plate of the storage capacitor C2 together. The first polar plate of the storage capacitor C2 is insulatively spaced from the second polar plate of the storage capacitor C2, so as to form the storage capacitor C2 with a dual-capacitor structure. For example, the second conductive layer 24 further includes an eleventh conductive portion S11 which will be mentioned below. The eleventh conductive portion S11 and the third conductive portion S3 are formed into an integrated structure. The orthographic projection of the eighth conductive portion S8 on the base substrate 21 partially overlaps with the eleventh conductive portion S11, and in the overlapping region, the eighth conductive portion S8 is electrically connected to the eleventh conductive portion S11 through a seventh via hole V7, so as to implement an electrical connection between the eighth conductive portion S8 and the third conductive portion S3.

Optionally, a third insulating layer 33 is provided between the third conductive layer 26 and the active layer 22, and the third insulating layer 33 insulatively spaces the third conductive layer 26 from the active layer 22.

In some specific embodiments, the second conductive layer 24 further includes the data line DL and the fourth conductive portion S4, and the data line DL extends in the first direction. The fourth conductive portion S4 is used to form the first electrode of the first switch transistor T22. The orthographic projection of the fourth conductive portion S4 on the base substrate 21 partially overlaps with an orthographic projection of the data line DL on the base substrate 21. In embodiments of the present disclosure, undetailed description of the fourth conductive portion S4 will not be repeated here, please refer to the above-mentioned embodiments.

In some specific embodiments, the first conductive layer 23 further includes a second gate line G2, and the first gate line G1 is electrically connected to the second gate line G2. The orthographic projection of the first gate line G1 on the base substrate 21 is located on a side of an orthographic projection of the second gate line G2 on the base substrate 21 close to the orthographic projection of the first conductive portion S1 on the base substrate 21. The orthographic projection of the fourth conductive portion S4 on the base substrate 21 is located between the orthographic projection of the first gate line G1 on the base substrate 21 and the orthographic projection of the second gate line G2 on the base substrate 21.

In embodiments of the present disclosure, both the first gate line G1 and the second gate line G2 extend in the second direction, and the first gate line G1 may be electrically connected to the second gate line G2 through a first connecting line Q1 extending in the first direction. Optionally, the first gate line G1, the second gate line G2 and the first connecting line Q1 may be provided on a same layer, that is, the first gate line G1, the second gate line G2 and the first connecting line Q1 may be formed by a same patterning process. The first gate line G1 and the second gate line G2 may be parallel to each other by using the above-mentioned method, so as to reduce a resistance on the first gate line G1 and improve a transmission efficiency.

In some specific embodiments, a width of each of the first gate line G1 and the second gate line G2 is less than the channel length of the drive transistor T21. Since the first gate line G1 and the second gate line G2 ensure a lower resistance, the first gate line G1 and the second gate line G2 may have a wider width. When the channel length of the drive transistor T21 is greater than the width of each of the first gate line G1 and the second gate line G2, the drive transistor T21 may also have a less width-to-length ratio, so as to improve the gray scale expansion effect.

In some specific embodiments, the display panel further includes the plurality of pixel cells P, and at least one pixel cell P includes a plurality of pixel circuits D. In the at least one pixel cell P, first electrodes of the drive transistors T21 of the plurality of pixel circuits D are electrically connected to each other, so that the number of the first power line V2 may be saved, which may be conducive to improving a pixel density.

Optionally, the third conductive layer 26 includes a second connecting line Q2. In a pixel cell P, the first electrodes of the drive transistors T21 of the plurality of pixel circuits D are electrically connected to each other through the second connecting line Q2.

Optionally, the first conductive layer 23 further includes a third connecting line Q3. The second connecting line Q2 extends in the second direction, and the third connecting line Q3 extends in the first direction. In a pixel cell P, the first electrode of the drive transistor T21 of a pixel circuit D and the first power line V2 are formed into forms an integrated structure, and the first power line V2 is electrically connected to the second connecting line Q2. For example, an orthographic projection of the first power line V2 on the base substrate 21 partially overlaps with an orthographic projection of the second connecting line Q2 on the base substrate 21, and in the overlapping region, the first power line V2 is electrically connected to the second connecting line Q2 through a via hole. In the pixel cell P, a first electrode of the drive transistor T21 of another pixel circuit D is electrically connected to the second connecting line Q2 through the third connecting line Q3, so that in a pixel cell P, the first electrodes of the drive transistors T21 of the plurality of pixel circuits D may be electrically connected to each other. An orthographic projection of the third connecting line Q3 on the base substrate 21 partially overlaps with the orthographic projection of the second connecting line Q2 on the base substrate 21, and in the overlapping region, the third connecting line Q3 may be electrically connected to the second connecting line Q2 through a via hole.

In some specific embodiments, the at least one pixel circuit D further includes the second switch transistor T23.

In some specific embodiments, a channel width-to-length ratio of each of the first switch transistor T22 and the second switch transistor T23 is greater than a channel width-to-length ratio of the drive transistor T21.

In embodiments of the present disclosure, since the first switch transistor T22 and the second switch transistor only need to perform a switching function, it may be beneficial to reduce a power consumption when the first switch transistor T22 and the second switch transistor have a larger width-to-length ratio relative to the drive transistor T21.

In the at least one pixel cell P, the first electrodes of the second switch transistors T23 of the plurality of pixel circuits D are electrically connected to each other.

In embodiments of the present disclosure, the active layer 22 further includes an eighth active portion A8, a ninth active portion A9 and a tenth active portion A10. The first conductive layer 23 further includes a ninth conductive portion S9, and the second conductive layer 24 further includes a tenth conductive portion S10 and an eleventh conductive portion S11. The eighth active portion A8 is used to form a channel portion of the second switch transistor, the ninth active portion A9 is used to form a first electrode connection portion of the second switch transistor, and the tenth active portion A10 is used to form a second electrode connection portion of the second switch transistor. The ninth conductive portion S9 is used to form the gate electrode of the second switch transistor T23, the tenth conductive portion S10 is used to form the first electrode of the second switch transistor T23, and the eleventh conductive portion S11 is used to form the second electrode of the second switch transistor T23.

The ninth active portion A9 and the tenth active portion A10 are arranged in the first direction. The eighth active portion A8 is located between the ninth active portion A9 and the tenth active portion A10, and is directly opposite to the ninth conductive portion S9. An orthographic projection of the ninth active portion A9 on the base substrate 21 partially overlaps with an orthographic projection of the tenth conductive portion S10 on the base substrate 21, and in the overlapping region, the ninth active portion A9 is electrically connected to the tenth conductive portion S10 through a sixth via hole V6. The tenth active portion A10 partially overlaps with the eleventh conductive portion S11, and in the overlapping region, the tenth active portion A10 is electrically connected to the eleventh conductive portion S11 through the seventh via hole V7.

In embodiments of the present disclosure, an orthographic projection of the eleventh conductive portion S11 on the base substrate 21 partially overlaps with an orthographic projection of the eighth conductive portion A8 on the base substrate 21, and in the overlapping region, the eleventh conductive portion S11 is electrically connected to the eighth conductive portion A8 through the seventh via hole V7, so as to implement an electrical connection between the second electrode of the second switch transistor T23 and the second polar plate of the storage capacitor C2.

In some specific embodiments, the second conductive layer 23 further includes a fourth connecting line Q4, and the third conductive layer 26 further includes a fifth connecting line Q5. In a pixel cell P, the first electrodes of the second switch transistors T23 of at least two pixel circuits D are electrically connected to each other through the fourth connecting line Q4, and the first electrodes of the second switch transistors T23 of the at least two pixel circuits D are electrically connected to each other through the fifth connecting line Q5.

For example, in FIG. 5a, a pixel cell P includes a red sub-pixel Pr, a white sub-pixel Pw, a blue sub-pixel Pb and a green sub-pixel Pg that are arranged in sequence from left to right, and the red sub-pixel Pr, the white sub-pixel Pw, the blue sub-pixel Pb and the green sub-pixel Pg are arranged in sequence in the second direction. A first electrode of the drive transistor T21 of the red sub-pixel Pr a is electrically connected to a first electrode of the drive transistor T21 of the white sub-pixel Pw through the fifth connecting line Q5, a first electrode of the drive transistor T21 of the blue sub-pixel Pb is electrically connected a first electrode of the drive transistor T21 of the green sub-pixel Pg through the fifth connecting line Q5, and the first electrode of the drive transistor T21 of the white sub-pixel Pw is electrically connected to the first electrode of the drive transistor T21 of the blue sub-pixel Pb through the fourth connecting line Q4.

The display panel configured in the above-mentioned way may provide a pixel cell P with a first power line V2 and a reference signal line V1, so that the number of the first power line V2 and the reference signal line V1 may be reduced, which may be conducive to improving the pixel density.

In some specific embodiments, in a pixel cell P, different sub-pixels have different colors, and light-emitting devices in the sub-pixels of different colors have different light-emitting efficiencies. In order to adapt to the light-emitting efficiency of each color, the channel portions of the drive transistors T2 of the plurality of pixel circuits D may have different width-to-length ratios. Since the width-to-length ratio of the channel portion of the drive transistor T2 is related to the drive current I, different sub-pixels are provided with corresponding width-to-length ratios, so that the different light-emitting devices may be provided with desired drive currents I, so as to adapt to the light-emitting efficiency of each light-emitting device.

For example, as shown in FIG. 4a and FIG. 5a, in some specific embodiments, the plurality of pixel circuits D in the at least one pixel cell P include the first pixel circuit Dr, the second pixel circuit Dw, the third pixel circuit Db and the fourth pixel circuit Dg. The first pixel circuit Dr, the second pixel circuit Dw, the third pixel circuit Db and the fourth pixel circuit Dg are electrically connected to light-emitting devices of different colors, respectively, and the second pixel circuit Dw is electrically connected to a white light-emitting device. A width-to-length ratio of the drive transistor T21 in each of the first pixel circuit Dr, the third pixel circuit Db and the fourth pixel circuit Dg is greater than a width-to-length ratio of the drive transistor in the second pixel circuit Dw. In other words, among the first pixel circuit Dr, the second pixel circuit Dw, the third pixel circuit Db and the fourth pixel circuit Dg, the width-to-length ratio of the drive transistor in the second pixel circuit Dw is minimum.

In this way, the width-to-length ratio of the channel portion of the drive transistor T21 in the second pixel circuit Dw may be minimized on the basis of ensuring that the second pixel circuit Dw provides a desired drive current I for the white light-emitting device.

For another example, in combination with FIG. 4a and FIG. 5a, in some specific embodiments, the plurality of pixel circuits D in the at least one pixel cell P include the first pixel circuit Dr, the second pixel circuit Dw, the third pixel circuit Db and the fourth pixel circuit Dg. The first pixel circuit Dr, the second pixel circuit Dw, the third pixel circuit Db and the fourth pixel circuit Dg are electrically connected to the light-emitting devices of different colors, and the first pixel circuit Dr is electrically connected to a red light-emitting device. The width-to-length ratio of the drive transistor T21 in each of the second pixel circuit Dw, the third pixel circuit Db and the fourth pixel circuit Dg is less than the width-to-length ratio of the drive transistor T21 in the first pixel circuit Dr. In other words, among the first pixel circuit Dr, the second pixel circuit Dw, the third pixel circuit Db and the fourth pixel circuit Dg, the width-to-length ratio of the drive transistor T21 in the first pixel circuit Dr is maximum.

In this way, the first pixel circuit Dr may still provide the desired drive current I for the red light-emitting device on the basis of minimizing the width-to-length ratio of the channel portion of the drive transistor T21 in each pixel circuit D.

Optionally, the third pixel circuit Db is electrically connected to a blue light-emitting device, and the fourth pixel circuit Dg is electrically connected to a green light-emitting device. The width-to-length ratios of the channel portions of the drive transistors T21 in the first pixel circuit Dr, the fourth pixel circuit Dg, the third pixel circuit Db and the second pixel circuit Dw may be reduced in sequence.

In some specific embodiments, the plurality of pixel circuits D in the at least one pixel cell P include the first pixel circuit Dr, the second pixel circuit Dw, and the third pixel circuit Db. The first pixel circuit Dr, the second pixel circuit Dw and the third pixel circuit Db are electrically connected to the light-emitting devices of different colors, and the first pixel circuit Dr is electrically connected to the red light-emitting device. A sum of a channel area of the drive transistor T21 in the second pixel circuit Dw and a channel area of the drive transistor T21 in the third pixel circuit Db is less than a channel area of the drive transistor T21 in the first pixel circuit Dr.

In this way, the first pixel circuit Dr may still provide the desired drive current I for the red light-emitting device on the basis of minimizing the width-to-length ratio of the channel portion of the drive transistor T21 in each pixel circuit D.

In some specific embodiments, at least one group of adjacent pixel circuits D meet: X<Y. The X represents a difference between channel lengths of the channel portions of the drive transistors T21 in the adjacent pixel circuits D; and the Y represents a difference between channel widths of the channel portion of the drive transistor T21 in the adjacent pixel circuits D.

In embodiments of the present disclosure, the group of adjacent pixel circuits D may refer to two adjacent pixel circuits D, or a plurality of adjacent pixel circuits D. The adjacent pixel circuits D may mean that no other pixel circuit exits between the two pixel circuits. Optionally, the adjacent pixel circuits D are adjacent to each other, and may also be adjacent to each other in the second direction. The details are determined according to actual needs, and will not be limited here.

In embodiments of the present disclosure, a plurality of devices are distributed in a channel length direction of the drive transistor T21, such as the seventh active portion A7, etc. Therefore, in embodiments of the present disclosure, when it is required to make the drive transistors T21 in different pixel circuits D have different width-to-length ratios, the channel width of the drive transistor T21 may be adjusted by a large margin, while the channel length of the drive transistor T21 may be adjusted by a small margin, Thus, an influence of the width-to-length ratio of the drive transistor T21 on other devices may be avoided to a large extent, and the drive transistor T21 may also have a better adjustment range of the width-to-length ratio.

In some specific embodiments, the drive transistors T21 of the plurality of pixel circuits D have a same channel length L, which may simplify a preparation process. Optionally, in embodiments of the present disclosure, the width-to-length ratio of the channel of the drive transistor T21 may be adjusted by adjusting the channel width W of the drive transistor T21.

In some specific embodiments, the drive transistors T21 of at least two pixel circuits D have different the channel lengths L. In this way, the drive transistor T21 of the pixel circuit D is provided with a corresponding channel length L according to actual conditions of each pixel circuit D.

In some specific embodiments, the display panel further includes a gate drive circuit GOA. The channel length L of at least one transistor in the gate drive circuit GOA is less than or equal to the channel width W of the at least one transistors in the gate drive circuit GOA.

In embodiments of the present disclosure, the channel length L of the transistor in the gate drive circuit GOA may be in a range of 4.5 μm to 8 μm, including a boundary value, and the channel width W of the transistor in the gate drive circuit GOA may be in a range of 6 μm to μm, including the boundary value. In this way, the transistor in the gate drive circuit GOA has a less size in the second direction, which may be conducive to realizing a narrow frame.

In some specific embodiments, an orthographic projection, on the base substrate 21, of a portion of the first conductive portion S1 electrically connected to the second active portion A2 overlaps with the orthographic projection of the second active portion A2 on the base substrate 21. In this way, the pixel circuit D may have a more compact structure, and an adjustable space of the channel portion of the drive transistor T21 may be increased, so that the channel length L of the channel portion of the drive transistor T21 and the channel width W of the channel portion of the drive transistor T21 may be adjusted in a large range, which may improve a design flexibility.

The present disclosure further provides a display device. The display device includes the above-mentioned display panel.

In other embodiments of the present disclosure, the display device may include a tablet personal computer (PC), a smart phone, a personal digital assistant (PDA), a portable multimedia player, a game console, or a wristwatch electronic apparatus, etc. However, embodiments of the present disclosure are not intended to limit a type of the display device. In some exemplary embodiments, the display device may be used not only in a large-sized electronic apparatus such as a television (TV) or an external billboard, etc., but also in a medium- or small-sized electronic apparatus such as a PC, a notebook computer, a car navigation apparatus or a camera, etc.

Embodiments of the present disclosure have been described above. However, the examples are for illustrative purposes only, and are not intended to limit the scope of the present disclosure. Although embodiments are described above separately, this does not mean that the measures in embodiments may not be advantageously used in combination. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A display panel, comprising:
   a base substrate; and
   a plurality of pixel circuits arranged on the base substrate, wherein at least one of the pixel circuits comprises a drive transistor and a first switch transistor;
   wherein the display panel further comprises:
   an active layer arranged on the base substrate, wherein the active layer comprises a first active portion and a second active portion, the first active portion is configured to form a channel portion of the drive transistor, and the second active portion is configured to form a second electrode connection portion of the first switch transistor; and
   a first conductive layer arranged on a side of the active layer away from the base substrate,
   wherein the first conductive layer comprises a first conductive portion, a portion of the first conductive portion is configured to form a gate electrode of the drive transistor, and another portion of the first conductive portion is electrically connected to the second active portion, and
   a channel length of the channel portion of the drive transistor is greater than a channel width of the channel portion of the drive transistor.

2. The display panel according to claim 1, wherein the display panel further comprises: a second conductive layer arranged on a side of the first conductive layer away from the base substrate, and
   wherein the second conductive layer comprises a second conductive portion, the second conductive portion is electrically connected to the second active portion and the first conductive portion, a size of the second conductive portion in a first direction is less than a channel length of the channel portion of the drive transistor, wherein the first direction comprises a direction pointing from a first electrode of the drive transistor to a second electrode of the drive transistor.

3. The display panel according to claim 2, wherein the first conductive layer further comprises a first gate line, and the first gate line is electrically connected to a gate electrode of the first switch transistor;
   the first conductive portion comprises a first side and a second side that are arranged in the first direction, and the second conductive portion comprises a third side and a fourth side that are arranged in the first direction;
   wherein an orthographic projection of a line where the first side is located on the base substrate is located on a side of an orthographic projection of the third side on the base substrate away from an orthographic projection of the fourth side on the base substrate, and an orthographic projection of a line where the second side is located on the base substrate is located on a side of the orthographic projection of the third side on the base substrate towards the orthographic projection of the fourth side on the base substrate.

4. The display panel according to claim 3, wherein the orthographic projection of the line where the second side is located on the base substrate is located on a side of the orthographic projection of the fourth side on the base substrate away from the orthographic projection of the third side on the base substrate.

5. The display panel according to claim 3, wherein the at least one of the pixel circuits further comprises a storage capacitor, the second conductive layer further comprises a third conductive portion configured to form the storage capacitor, and the third conductive portion comprises a fifth side and a sixth side that are arranged in the first direction;
wherein an orthographic projection of the fifth side on the base substrate is located on a side of an orthographic projection of the sixth side on the base substrate away from an orthographic projection of the second side on the base substrate, and the orthographic projection of the sixth side on the base substrate is located on a side of an orthographic projection of the first side on the base substrate towards the orthographic projection of the second side on the base substrate.

6. The display panel according to claim 2, wherein the second conductive layer further comprises a data line and a fourth conductive portion; and
the fourth conductive portion is configured to form a first electrode of the first switch transistor, and an orthographic projection of the fourth conductive portion on the base substrate partially overlaps with an orthographic projection of the data line on the base substrate.

7. The display panel according to claim 6, wherein the first conductive layer further comprises a first gate line and a second gate line, and the first gate line is electrically connected to a gate electrode of the first switch transistor and the second gate line;
an orthographic projection of the first gate line on the base substrate is located on a side of an orthographic projection of the second gate line on the base substrate close to an orthographic projection of the drive transistor on the base substrate; and
an orthographic projection of the fourth conductive portion on the base substrate is located between the orthographic projection of the first gate line on the base substrate and the orthographic projection of the second gate line on the base substrate.

8. The display panel according to claim 7, wherein a width of each of the first gate line and the second gate line is less than the channel length of the drive transistor.

9. The display panel according to claim 1, wherein the display panel further comprises a plurality of pixel cells, and at least one of the pixel cells comprises a plurality of pixel circuits, and
wherein in the at least one of the pixel cells, first electrodes of drive transistors of the plurality of pixel circuits are electrically connected to each other.

10. The display panel according to claim 9, wherein the at least one of the pixel circuits further comprises a second switch transistor, and
wherein in the at least one of the pixel cells, first electrodes of second switch transistors of the plurality of pixel circuits are electrically connected to each other.

11. The display panel according to claim 10, wherein a channel width-to-length ratio of each of the first switch transistor and the second switch transistor is greater than a channel width-to-length ratio of the drive transistor.

12. The display panel according to claim 1, wherein at least one group of adjacent pixel circuits meet:
X<Y;
wherein the X represents: a difference between channel lengths of drive transistors in the adjacent pixel circuits; and the Y represents: a difference between channel widths of drive transistors in the adjacent pixel circuits.

13. The display panel according to claim 1, wherein the plurality of pixel circuits comprise a first pixel circuit, a second pixel circuit and a third pixel circuit;
wherein the first pixel circuit, the second pixel circuit and the third pixel circuit are electrically connected to light-emitting devices of different colors, respectively, and the first pixel circuit is electrically connected to a red light-emitting device; and
a sum of a channel area of a drive transistor in the second pixel circuit and a channel area of a drive transistor in the third pixel circuit is less than a channel area of a drive transistor in the first pixel circuit.

14. The display panel according to claim 1, wherein the plurality of pixel circuits comprise a first pixel circuit, a second pixel circuit, a third pixel circuit and a fourth pixel circuit, wherein the first pixel circuit, the second pixel circuit, the third pixel circuit and the fourth pixel circuit are electrically connected to light-emitting devices of different colors, respectively, and the second pixel circuit is electrically connected to a white light-emitting device; and
a width-to-length ratio of a channel portion of a drive transistor in each of the first pixel circuit, the third pixel circuit and the fourth pixel circuit is greater than a width-to-length ratio of a channel portion of a drive transistor in the second pixel circuit.

15. The display panel according to claim 1, wherein the plurality of pixel circuits comprise a first pixel circuit, a second pixel circuit, a third pixel circuit and a fourth pixel circuit, wherein the first pixel circuit, the second pixel circuit, the third pixel circuit and the fourth pixel circuit are electrically connected to light-emitting devices of different colors, respectively, and the first pixel circuit is electrically connected to a red light-emitting device; and
a width-to-length ratio of a drive transistor in each of the second pixel circuit, the third pixel circuit and the fourth pixel circuit is less than a width-to-length ratio of a drive transistor in the first pixel circuit.

16. The display panel according to claim 1, wherein drive transistors of the plurality of pixel circuits have a same channel length.

17. The display panel according to claim 1, wherein drive transistors of at least two pixel circuits have different channel lengths.

18. The display panel according to claim 1, wherein a width-to-length ratio of the channel portion of the drive transistor is greater than or equal to 1/5 and less than or equal to 25/12.

19. The display panel according to claim 1, wherein the display panel further comprises a gate drive circuit;
wherein a channel length of at least some transistors in the gate drive circuit is less than or equal to a channel width of the at least one transistor in the gate drive circuit,
wherein an orthographic projection of a portion of the first conductive portion electrically connected to the second active portion on the base substrate overlaps with an orthographic projection of the second active portion on the base substrate.

20. A display device, comprising the display panel according to claim 1.

* * * * *